(12) United States Patent
Goma et al.

(10) Patent No.: US 7,186,578 B2
(45) Date of Patent: Mar. 6, 2007

(54) THIN SHEET PRODUCTION METHOD AND THIN SHEET PRODUCTION DEVICE

(75) Inventors: Shuji Goma, Katsuragi (JP); Hirozumi Gokaku, Kitakatsuragi-gun (JP); Toshiaki Nagai, Tenri (JP); Kozaburo Yano, Nabari (JP); Masahiro Tadokoro, Toyohashi (JP); Yasuhiro Nakai, Ise (JP)

(73) Assignees: Sharp Kabushiki Kaisha, Osaka (JP); Shinko Electric Co., Ltd., Tokyo (JP)

( * ) Notice: Subject to any disclaimer, the term of this patent is extended or adjusted under 35 U.S.C. 154(b) by 0 days.

(21) Appl. No.: 10/519,560

(22) PCT Filed: Jun. 24, 2003

(86) PCT No.: PCT/JP03/08012

§ 371 (c)(1),
(2), (4) Date: Dec. 28, 2004

(87) PCT Pub. No.: WO2004/003262

PCT Pub. Date: Jan. 8, 2004

(65) Prior Publication Data
US 2005/0239225 A1  Oct. 27, 2005

(30) Foreign Application Priority Data
Jun. 28, 2002  (JP) ............................. 2002-191191

(51) Int. Cl.
*H01L 21/00* (2006.01)

(52) U.S. Cl. ...................................................... 438/22
(58) Field of Classification Search .................. 438/22
See application file for complete search history.

(56) References Cited

U.S. PATENT DOCUMENTS

| 6,596,075 | B2 * | 7/2003 | Igarashi et al. | ................ 117/26 |
| 6,682,990 | B1 * | 1/2004 | Iwane et al. | ................. 438/458 |
| 6,709,555 | B1 * | 3/2004 | Ogure et al. | ............ 204/224 R |
| 6,802,900 | B2 * | 10/2004 | Iwane et al. | ................... 117/54 |

(Continued)

FOREIGN PATENT DOCUMENTS

DE        102 97 102 T5        9/2004

(Continued)

OTHER PUBLICATIONS

Translation of the International Preliminary Examination Report mailed Dec. 9, 2004 in corresponding PCT Application No. PCT/JP2003/008012.

(Continued)

*Primary Examiner*—Thao P. Le
(74) *Attorney, Agent, or Firm*—Nixon & Vanderhye P.C.

(57) ABSTRACT

In order to obtain a thin plate manufacturing method capable of extremely increasing manufacturing efficiency by enlarging the production scale and remarkably reducing the manufacturing cost per unit area and an apparatus for manufacturing this thin plate, a method and an apparatus performing introduction of a substrate into a main chamber and discharge of the substrate from the main chamber through at least one subsidiary chamber adjacent to the main chamber are employed when manufacturing a silicon thin plate by dipping a surface layer part of the substrate into a silicon melt in a crucible arranged in the main chamber for bonding silicon to the surface of the substrate.

19 Claims, 25 Drawing Sheets

U.S. PATENT DOCUMENTS

| | | | |
|---|---|---|---|
| 6,871,773 B2 * | 3/2005 | Fukunaga et al. | 228/122.1 |
| 2004/0053433 A1 | 3/2004 | Goma et al. | |
| 2004/0238024 A1 | 12/2004 | Goma et al. | |

FOREIGN PATENT DOCUMENTS

| | | |
|---|---|---|
| EP | 1 113 096 A1 | 7/2001 |
| JP | 61-275119 A | 12/1986 |
| JP | 62-79616 A | 4/1987 |
| JP | 63-102766 U | 7/1988 |
| JP | 6-64913 A | 3/1994 |
| JP | 6-252072 | 9/1994 |
| JP | 9-110591 A | 4/1997 |
| JP | 10-29895 | 2/1998 |
| JP | 2002-193608 | 7/2002 |
| JP | 2002-289544 A | 10/2002 |
| JP | 2003-59849 A | 2/2003 |
| WO | 02/20882 A1 | 3/2002 |
| WO | 02/24982 | 3/2002 |

OTHER PUBLICATIONS

German Office Action and English translation thereof mailed Jan. 31, 2006 in corresponding German application 103 92 847.2-43.

* cited by examiner

FIG.19

| STEP \ ELAPSED TIME (SEC.) | 0 | 5 | 10 | 15 | 20 | 25 | 30 | 35 | 40 | 45 | 50 | 55 | 60 | 65 | 70 |
|---|---|---|---|---|---|---|---|---|---|---|---|---|---|---|---|
| INTRODUCE SUBSTRATE INTO LOADING SUBSIDIARY CHAMBER | ↑ | | | | | | | | | | | | | | ↑ |
| EVACUATE LOADING SUBSIDIARY CHAMBER | | | ↑ | | | | | | | | | | | | |
| PURGE LOADING SUBSIDIARY CHAMBER WITH Ar | | | | ↑ | | | | | | | | | | | |
| LOAD ONE SUBSTRATE | | | | | ↑ | | | | | | ↑ | | | | |
| MOUNT ON DIPPING MECHANISM | | | | | | | ↑ | | | | | ↑ | | | |
| CONTROL TEMPERATURE OF SUBSTRATE | | | | | | | | | ↑ | | | | | | |
| DIPPING OPERATION | | | | | | ↑ | ↑ | | ↑ | ↑ | | ↑ | | | |
| DEMOUNT FROM DIPPING MECHANISM | | | | | | | | ↑ | | | | | ↑ | | |
| UNLOAD ONE SUBSTRATE | | | | | | | | | | ↑ | | ↑ | | ↑ | |
| DISCHARGE SUBSTRATE FROM UNLOADING SUBSIDIARY CHAMBER | ↑ | | | | | | | | | | | | | | |
| EVACUATE UNLOADING SUBSIDIARY CHAMBER | | | ↑ | | | | | | | | | | | | |
| PURGE UNLOADING SUBSIDIARY CHAMBER WITH Ar | | | | ↑ | | | | | | | | | | | |

FIG.22

| STEP \ ELAPSED TIME (SEC.) | 0 | 5 | 10 | 15 | 20 | 25 | 30 | 35 | 40 | 45 |
|---|---|---|---|---|---|---|---|---|---|---|
| INTRODUCE SUBSTRATE INTO LOADING SUBSIDIARY CHAMBER | → | | | | | | | | | |
| EVACUATE LOADING SUBSIDIARY CHAMBER | | → | | | | | | | | |
| PURGE LOADING SUBSIDIARY CHAMBER WITH Ar | | | → | | | | | | | |
| LOAD PLURALITY OF SUBSTRATES | | | | → | | | | | | |
| MOUNT ON DIPPING MECHANISM | → | | → | | → | | → | | → | |
| CONTROL TEMPERATURE OF SUBSTRATES | | → | | → | | → | | → | | → |
| DIPPING OPERATION | | | → | | → | | → | | → | |
| DEMOUNT FROM DIPPING MECHANISM | → | | → | | → | | → | | → | |
| UNLOAD PLURALITY OF SUBSTRATES | | | | | → | | | | | |
| DISCHARGE SUBSTRATES FROM UNLOADING SUBSIDIARY CHAMBER | | | | | | → | | | | |
| EVACUATE UNLOADING SUBSIDIARY CHAMBER | | | | | | | → | | | |
| PURGE UNLOADING SUBSIDIARY CHAMBER WITH Ar | | | | | | | | → | | |

FIG.24

| STEP \ ELAPSED TIME (SEC.) | 0 | 5 | 10 | 15 | 20 | 25 | 30 |
|---|---|---|---|---|---|---|---|
| INTRODUCE SUBSTRATE INTO LOADING SUBSIDIARY CHAMBER | → | | | | | | |
| EVACUATE LOADING SUBSIDIARY CHAMBER | | → | | | | | |
| PURGE LOADING SUBSIDIARY CHAMBER WITH Ar | | | → | | | | |
| LOAD PLURALITY OF SUBSTRATES | | | | → | | | |
| (FIRST DIPPING MECHANISM) | | | | | | | |
| MOUNT ON DIPPING MECHANISM | → | → | | → | | | |
| CONTROL TEMPERATURE OF SUBSTRATES | → | → | | | → | | |
| DIPPING OPERATION | | → | → | | | ---→ | |
| DEMOUNT FROM DIPPING MECHANISM | → | → | | → | | | --→ |
| (SECOND DIPPING MECHANISM) | | | | | | | |
| MOUNT ON DIPPING MECHANISM | | → | | → | | → | |
| CONTROL TEMPERATURE OF SUBSTRATES | | | → | | → | | → |
| DIPPING OPERATION | → | → | | | | ---→ | |
| DEMOUNT FROM DIPPING MECHANISM | | → | | → | | → | |
| UNLOAD PLURALITY OF SUBSTRATES | → | | | | | | |
| DISCHARGE SUBSTRATES FROM UNLOADING SUBSIDIARY CHAMBER | | → | | | | | |
| EVACUATE UNLOADING SUBSIDIARY CHAMBER | | | | → | | | |
| PURGE UNLOADING SUBSIDIARY CHAMBER WITH Ar | | | | | → | | |

THIN SHEET PRODUCTION METHOD AND THIN SHEET PRODUCTION DEVICE

This application is the US national phase of international application PCT/JP03/08012 filed 24 Jun. 2003 which designated the U.S. and claims benefit of JP 2002-191191 (P), dated 28 Jun. 2002, the entire content of which is hereby incorporated by reference.

TECHNICAL FIELD

The present invention relates to a thin plate manufacturing method and a thin plate manufacturing apparatus, and more specifically, it relates to a silicon thin plate manufacturing method and a silicon thin plate manufacturing apparatus.

BACKGROUND ART

Silicon is employed for a public solar cell. While conversion efficiency is decreased in order of single-crystalline silicon, polycrystalline silicon and amorphous silicon, the cost is reduced in the aforementioned order to readily implement a larger area. Among these, amorphous silicon, which can be deposited from a raw material of $SiH_4$ on a substrate of glass, plastic or metal by CVD (Chemical Vapor Deposition), is at a low cost and can be readily increased in area. The conversion efficiency is about 12% at the maximum.

As to single-crystalline silicon, an ingot having a diameter of 150 mm (6 inches) or 200 mm (8 inches) is manufactured by the CZ (Czochralski) method and can be increased in size, and the conversion efficiency thereof can exceed 15%.

As to polycrystalline silicon, a method of solidifying/growing the same from a liquid phase or a method of depositing the same from a vapor phase is researched. While polycrystalline silicon can be readily increased in area similarly to amorphous silicon, the conversion efficiency thereof is on an intermediate position between those of single-crystalline silicon and amorphous silicon.

Each of the aforementioned various types of silicon manufacturing methods increases the area, improves of the conversion efficiency and reduces the manufacturing cost. However, the unit generating cost thereof is rather expensive as compared with the present large-scale power generation system such as nuclear power generation or thermal power generation, and the manufacturing cost must be reduced.

DISCLOSURE OF THE INVENTION

An object of the present invention is to provide a method of manufacturing a thin plate of silicon capable of remarkably increasing manufacturing efficiency by enlarging the production scale while ensuring high quality and extremely reducing the manufacturing cost per unit area and an apparatus for manufacturing this thin plate.

The inventive thin plate manufacturing method is a method of manufacturing a thin plate by dipping a surface layer part of a substrate into a melt of a substance including at least either a metallic material or a semiconductor material in a crucible arranged in a main chamber and solidifying the melt on the surface of the substrate. The substrate is loaded into the main chamber through at least one loading subsidiary chamber adjacent to the main chamber and the substrate is unloaded from the main chamber through at least one unloading subsidiary chamber adjacent to the main chamber.

When the atmosphere enters the main chamber having an inert gas atmosphere, silicon and oxygen react with each other if the melt is a silicon melt, for example, to cause Si loss and powder adhesion to the inner wall of the main chamber due to generation of $SiO_X$. It is possible to remarkably improve operating efficiency while reliably preventing introduction of the atmosphere into the main chamber or the like and ensuring high quality by employing the subsidiary chamber as hereinabove described for loading/unloading the substrate through the subsidiary chamber. In other words, it is possible to directly prevent introduction of the atmosphere into the main chamber through the subsidiary chamber when loading/unloading a large quantity of substrates into/from the main chamber at high efficiency.

Switching means is preferably arranged between the main chamber and the subsidiary chamber in preparation for a case of an unexpected situation or the like. When the switching means is set to be closed in an emergency, the degree of trouble can be reduced. Therefore, the manufacturing yield can be improved and a high-quality thin plate can be ensured.

An airtight door, for example, can be employed for the switching means. A gate valve is a representative airtight door. The thin plate adhering to the substrate is a thin plate of polycrystalline silicon solidified/grown on a growth surface of the substrate, for example.

A method of operating an apparatus formed by combining the aforementioned subsidiary and main chambers with each other is now described. When the substrate is loaded into the main chamber, the substrate is introduced into the said subsidiary chamber while closing the switching means, then the atmosphere of the subsidiary chamber is equalized with that of the main chamber, and the switching means is thereafter opened for loading the substrate into the main chamber. When the substrate to which a silicon thin plate, for example, is bonded is unloaded from the main chamber, the switching means is opened after the atmosphere of the subsidiary chamber is equalized with that of the main chamber so that the substrate is unloaded from the main chamber into the subsidiary plate, the switching means is closed, and the substrate is thereafter discharged.

Inert gas is preferably introduced into the aforementioned main chamber, and the pressure of the atmosphere in the main chamber is preferably set not more than the atmospheric pressure.

When the pressure of the main chamber is set negative as described above, airtightness of the main chamber can be easily maintained, the usage of the inert gas can be reduced and the manufacturing cost can be reduced.

The aforementioned subsidiary chamber is constituted of a loading subsidiary chamber and an unloading subsidiary chamber so that the substrate can be loaded into the main chamber through the loading subsidiary chamber while the substrate to which the thin plate is bonded can be unloaded from the main chamber through the unloading subsidiary chamber.

According to the aforementioned method, arrangement can be so made that the flow of loading the substrate and the flow of the substrate to which a silicon thin plate, for example, is bonded do not interfere with each other. The expression "the substrate to which the thin plate is bonded" indicates a state of the substrate dipped in the aforementioned melt for a prescribed time so that the melt is solidified on a growth surface of the substrate to form the thin plate present on the substrate. The solidified thin plate may be so displaced by an impact or the like that the thin plate is merely placed on the substrate. Further, the thin plate may adhere to the substrate as such after the aforementioned solidification. More widely, a solid phase may grow to form the thin plate when the growth surface of the substrate is in the melt.

When the loading subsidiary chamber and the unloading subsidiary chamber as well as the main chamber are opened and closed by opening/closing the aforementioned switching means, switching timings of the switching means for the loading subsidiary chamber and the switching means for the unloading subsidiary chamber can be synchronized with each other.

Evacuation and inert gas purge of the subsidiary chamber requiring long duration are remarkable factors elongating the stroke (cycle time for thin plate manufacturing). Operations of the two subsidiary chambers are so synchronized with each other as hereinabove described that the two subsidiary chambers can be operated in a time required for operating a single subsidiary chamber.

In the aforementioned main chamber, the substrate is preferably mounted on a dipping mechanism so that the crystal growth surface of the substrate is opposed to a silicon melt, for example, for bonding the silicon thin plate and the thin plate growth surface to which the silicon thin plate is bonded is thereafter directed upward on a position other than that immediately above a crucible for unloading the substrate from the dipping mechanism along with the thin plate. The growth surface is opposed to the melt for preventing side surfaces other than the surface for growing the thin plate from dipping in the melt to the utmost and suppressing the quantity of the melt solidified on these portions, thereby improving the material utilization efficiency and reducing the degree of melt contamination. Further, the growth surface is so directed upward that the thin plate can be prevented from falling from the substrate during transfer or due to impact at the time of unloading the substrate.

As hereinabove described, the substrate is preferably mounted on and demounted from the dipping mechanism on the position other than that immediately above the crucible. Mounting and demounting are so performed on the position other than that immediately above the crucible that the melt can be prevented from contamination caused by fine particles falling from engaging portions and entering the melt in the crucible in mounting and demounting.

Before the aforementioned thin plate is separated from the substrate, the substrate to which the thin plate is bonded is preferably cooled on at least one position in the main chamber, in the subsidiary chamber or outside the chambers (outside the main chamber and outside the subsidiary chamber).

According to the aforementioned method, the substrate is sufficiently cooled before reaching a separator for separating the substrate and the thin plate from each other, whereby the separator and peripheral equipment thereof are not exposed to high heat and deteriorated in durability or the like. Further, the thin plate and the substrate can be easily handled after separation.

When the quantity of the melt in the aforementioned crucible is reduced to a prescribed level, the operation of the dipping mechanism can be so stopped as to refill the raw material in the crucible while not restarting the operation of the dipping mechanism until the temperature of the melt in the crucible and waving of the melt level are thereafter stabilized.

According to the above, temperature change of the melt and swinging of the melt resulting from refilling can be suppressed. Thus, the shape and the quality of the thin plate can be maintained.

In the aforementioned refilling, the raw material can be loaded into the main chamber through a refilling subsidiary chamber adjacent to the main chamber when refilling the raw material into the crucible.

Further, a plurality of substrates can be simultaneously introduced into the aforementioned subsidiary chamber so that the substrates are loaded into the main chamber one by one from the subsidiary chamber. In addition, the substrates to which thin plates are bonded may be unloaded one by one from the main chamber into the subsidiary chamber and simultaneously discharged from the subsidiary chamber. Switching means such as a gate valve may be interposed between the main chamber and the subsidiary chamber, as a matter of course.

Evacuation and inert gas purge of the subsidiary chamber requiring long duration are remarkable factors elongating the cycle time. A plurality of substrates are so introduced into the subsidiary chamber as described above that influence exerted on the stroke by an atmosphere control operation in the subsidiary chamber can be relaxed.

A plurality of the aforementioned substrates may be simultaneously introduced into the subsidiary chamber, simultaneously transferred to a mounting standby position in the main chamber from the subsidiary chamber and shifted one by one from the mounting standby position to a mounting position for the dipping mechanism. Further, the substrates may be transferred one by one from a demounting position for demounting the substrates to which thin plates are bonded from the dipping mechanism to an unloading standby position in the main chamber for simultaneously unloading a plurality of substrates from the unloading standby position into the subsidiary chamber when a prescribed number of substrates are accumulated on the unloading standby position.

According to the aforementioned method, the operation of the subsidiary chamber and that of the dipping mechanism can be so individually performed that the stroke can be reduced.

The aforementioned dipping mechanism may perform demounting of the substrate to which the thin plate is bonded and mounting of a substrate to which a thin plate is newly bonded through the same operation.

Also according to this method, the substrate can be mounted on and demounted from the dipping mechanism through a single action for reducing the stroke.

Another thin plate manufacturing method according to the present invention is a method of manufacturing a thin plate by dipping a surface layer part of a substrate held by a dipping mechanism into a melt of a substance including at least either a metallic material or a semiconductor material in a crucible arranged in a main chamber and solidifying the said melt on the surface of the substrate. According to this thin plate manufacturing method, the dipping mechanism comprises first substrate transport means for transporting the substrate in a direction for dipping and unloading the same into and from the melt, second substrate transport means enabling transportation of the substrate in a second direction different from the first direction and substrate rotation means capable of rotating the substrate by 360°, and dips the surface layer part of the substrate into the melt in the crucible by controlling operations of the first and second substrate transport means and the substrate rotation means.

The aforementioned first substrate transport means can be formed by vertical transport means, and the second substrate transport means can be taken as means for transporting the substrate in a direction of progressive movement. The aforementioned substrate rotation means and operations in the aforementioned two directions are so combined with each other that a controllable dipping operation can be naturally performed.

The aforementioned substrate rotation means preferably rotates the substrate by applying actuating force with reference to a supporting point of its rotation center on a power point different from the supporting point and rotating the power point about the supporting point.

According to the aforementioned structure, the dipping operation and a subsequent operation of rotating the substrate upward so that the formed thin plate does not fall can be easily performed.

The aforementioned substrate is preferably mounted on a substrate mounting member mounted to be rotatable about the supporting point and rotatable about the power point.

According to the aforementioned structure, the substrate mounting member can be easily rotated about the supporting point with excellent controllability in association with the power point. This substrate mounting member is constituted of a pedestal in which the substrate is directly engaged and a pedestal support member fixing the pedestal between the supporting point and the power point, for example. The pedestal support member is mounted to be rotatable along with the supporting point as well as the power point.

A plurality of power points can be arranged with respect to a single aforementioned support point.

In the case of this structure, the tolerance between an intended orbit and the actual orbit can be reduced by making control with the plurality of power points and controllability can be improved due to the increased degree of freedom of the orbit when the inertia of the substrate mounting member is large, for example.

In a series of operations of the aforementioned dipping mechanism moving the substrate from a mounting/demounting position for mounting and demounting the substrate to a position for dipping the substrate into the melt, making the dipping operation on the substrate for dipping the same and thereafter moving the substrate to the mounting/demounting position for demounting the substrate, the direction of the horizontal operation of the substrate in the dipping operation can be equalized with the operational direction for moving the substrate to the mounting/demounting position.

According to the aforementioned method, the direction of movement may not be reversed while dipping the substrate into the melt and directing the same upward. Therefore, the time for directing the substrate upward after bonding the thin plate thereto can be shortened. Consequently, the time when the formed thin plate may possibly fall can be shortened and the recovery of the thin plate can be improved.

The aforementioned dipping mechanism can mount a first substrate on a first position in the main chamber, move onto the crucible for dipping the substrate into the melt, thereafter move, demount the first substrate to which the thin plate is bonded on a second position different from the first position, mount a second substrate to which a thin plate is newly bonded on the position, move onto the crucible for dipping the substrate into the crucible, thereafter move to the first position and demount the second substrate to which the thin plate is bonded on this position.

According to this method, the dipping mechanism performs the dipping operation in both of the forward and backward paths when reciprocating on the crucible along a prescribed orbit, for example, whereby the operating efficiency can be increased. Consequently, the stroke can be reduced.

The position of the melt level in the aforementioned crucible may be detected for controlling the operation of dipping the substrate mounted on the dipping mechanism into the melt in response to the position of the melt level. For example, the depth for dipping the substrate mounted on the dipping mechanism into the melt may be controlled to be constant in response to the position of the melt level. The aforementioned control of the dipping operation can be employed also when the thickness of the substrate fluctuates.

According to this method, the level of the melt may not be kept at a constant position but the frequency of refilling the melt can be reduced. Thus, the quality of the thin plate can be maintained and the operating efficiency can be improved.

A plurality of dipping mechanisms may be employed for a single aforementioned crucible for bonding the thin plate to the substrate.

According to the aforementioned method, the time for converting a constant quantity of melt to the thin plate can be reduced. Consequently, the stroke can be reduced.

Still another thin plate manufacturing method according to the present invention is a method of manufacturing a thin plate by mounting a substrate on a dipping mechanism provided in a main chamber, dipping a surface layer part of the substrate into a melt in a crucible arranged in the main chamber and bonding a thin plate to the surface of the substrate, for manufacturing the thin plate by arranging a plurality of dipping mechanisms with respect to the crucible.

As hereinabove described, a plurality of dipping mechanisms are so employed that the time for converting a constant quantity of melt to a thin plate can be reduced.

While a first dipping mechanism included in the aforementioned plurality of dipping mechanisms performs a dipping operation, a second dipping mechanism different from the first dipping mechanism preferably performs at least one of operations of mounting the substrate, demounting the substrate to which the thin plate is bonded, temperature control of the substrate and movement of the substrate.

While the time of the dipping operation rate-determining the stroke cannot be changed, the second dipping mechanism parallelly performs another prescribed operation while the first dipping mechanism performs the dipping operation so that the stroke can be reduced.

In every one of the aforementioned thin plate manufacturing methods, the temperature of the substrate is preferably controlled before the same is mounted on the dipping mechanism. According to this method, the stroke can be reduced for improving the operating efficiency. The temperature of the aforementioned substrate, generally controlled in the main chamber, may alternatively be controlled in the subsidiary chamber.

A thin plate manufacturing apparatus according to the present invention is a thin plate manufacturing apparatus for manufacturing a thin plate by mounting a substrate on a dipping mechanism provided in a main chamber, dipping a surface layer part of the substrate in the aforementioned melt in a crucible arranged in a main chamber and bonding a thin plate to the surface of the substrate. This thin plate manufacturing apparatus has at least one loading subsidiary chamber for introducing the substrate from outside the apparatus into the main chamber and has at least one unloading subsidiary chamber for unloading and discharging the substrate to which the thin plate is bonded from the main chamber.

When the atmosphere enters the main chamber having an inert gas atmosphere, silicon and oxygen react with each other if the melt is a silicon melt, for example, to cause Si loss and powder adhesion to the inner wall of the main chamber due to generation of $SiO_X$. It is possible to remarkably improve operating efficiency while reliably preventing introduction of the atmosphere into the main chamber or the like and ensuring high quality by employing the subsidiary chamber as hereinabove described for loading/unloading the substrate through the subsidiary chamber. In other words, it is possible to directly prevent introduction of the atmosphere into the main chamber through the subsidiary chamber when loading/unloading a large quantity of substrates into/from the main chamber at high efficiency.

Switching means can be provided between the aforementioned main chamber and the subsidiary chamber.

According to this structure, the atmosphere of the subsidiary chamber can be evacuated and purged with inert gas to match with the atmosphere of the main chamber in response to introduction of the substrate into the subsidiary chamber or loading in the main chamber. Therefore, it is possible to maintain the main chamber in an inert gas atmosphere of negative pressure with high stability.

The aforementioned loading subsidiary chamber and the unloading subsidiary chamber may be provided on positions opposite to each other through the main chamber.

According to the aforementioned structure, interference between the substrate before bonding of the thin plate and the substrate after bonding of the thin plate can be prevented and the flow of the substrate can be smoothed.

The thin plate manufacturing apparatus may further have a refilling subsidiary chamber adjacent to the main chamber through switching means for supplying a refilling raw material to the main chamber through the refilling subsidiary chamber.

According to this structure, refilling can be performed while maintaining the atmosphere of the main chamber, whereby the time between stoppage of the dipping operation for refilling and restarting of the dipping operation can be reduced.

Another thin plate manufacturing apparatus according to the present invention is a manufacturing apparatus for manufacturing a thin plate by dipping a surface layer part of a substrate held by a dipping mechanism into a melt of a substance including at least either a metallic material or a semiconductor material in a crucible arranged in a main chamber and solidifying the melt on the surface of the substrate. In this thin plate manufacturing apparatus, the dipping mechanism comprises first substrate transport means for transporting the substrate in a direction for dipping and unloading the substrate into and from the melt, second substrate transport means enabling transportation of the substrate in a second direction different from the first direction and substrate rotation means capable of rotating the substrate by 360°.

According to the aforementioned structure, a controllable dipping operation can be naturally performed by combining the aforementioned substrate rotation means and the transport means of the aforementioned two directions with each other.

The aforementioned substrate rotation means may have a mechanism for rotating the substrate by applying actuating force with reference to a supporting point of its rotation center on a power point different from the supporting point and rotating the power point about the said supporting point.

According to the aforementioned structure, the dipping operation and a subsequent operation of rotating the substrate upward so that the formed thin plate does not fall can be easily performed.

The thin plate manufacturing apparatus preferably further comprises a substrate mounting member mounted to be rotatable about the aforementioned supporting point and rotatable about the power point for mounting the substrate.

According to the aforementioned structure, the substrate mounting member can be easily rotated about the supporting point with excellent controllability in association with the power point.

A plurality of power points may be arranged with respect to one supporting point. Consequently, the dipping operation can be controlled with excellent controllability also when the dipping mechanism is increased in size to increase the size of the substrate mounting member, for example.

Still another thin plate manufacturing apparatus according to the present invention is a thin plate manufacturing apparatus for manufacturing a thin plate by mounting a substrate on a dipping mechanism provided in a main chamber, dipping a surface layer part of the substrate in the aforementioned melt and bonding a thin plate to the surface of the substrate. In this thin plate manufacturing apparatus, a plurality of dipping mechanisms are provided with respect to the crucible.

According to the above, a thin plate manufacturing apparatus of high efficiency can be constituted.

Every one of the aforementioned thin plate manufacturing apparatuses according to the present invention preferably comprises substrate temperature control means on a front stage position of the substrate mounting position.

According to the aforementioned apparatus structure, the cycle time can be reduced, the manufacturing efficiency can be improved and the manufacturing cost can be reduced.

BRIEF DESCRIPTION OF THE DRAWINGS

FIG. 19 is a diagram showing the time series of thin plate manufacturing with the thin plate manufacturing apparatus shown in FIG. 18.

FIG. 22 is a diagram showing the time series of thin plate manufacturing with the thin plate manufacturing apparatus shown in FIG. 21.

FIG. 24 is a diagram showing the time series of thin plate manufacturing with the thin plate manufacturing apparatus shown in FIG. 23.

BEST MODES FOR CARRYING OUT THE INVENTION

Embodiments of the present invention are now described with reference to the drawings.

First Embodiment

Figure 1:
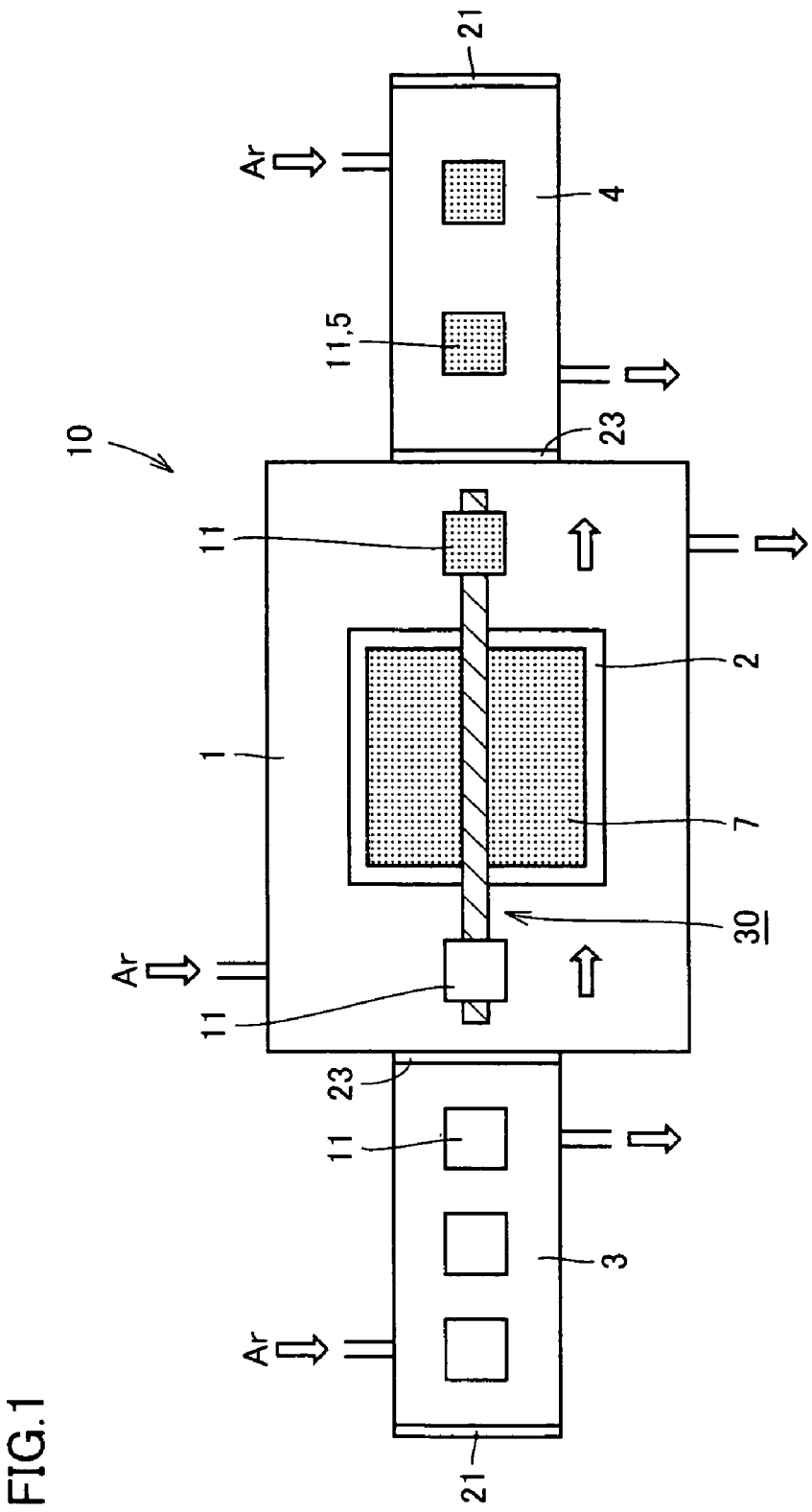
FIG. 1 is a diagram showing a thin plate manufacturing apparatus according to a first embodiment of the present invention.

FIG. 1 is a diagram illustrating a thin plate manufacturing apparatus according to a first embodiment of the present invention. The thin plate manufacturing apparatus 10 shown in FIG. 1 has a main chamber 1 in which a crucible 2 is arranged and two subsidiary chambers 3 and 4 provided adjacently to the main chamber. The crucible 2 in the main chamber 1 reserves a silicon melt 7, and a dipping mechanism 30 for dipping a surface layer part of each substrate 11 in the silicon melt 7 is arranged. The main chamber is maintained at pressure slightly lower than the atmospheric pressure, i.e., negative pressure through introduction of inert gas. In the thin plate manufacturing apparatus shown in FIG. 1, Ar gas is introduced and the pressure is set to 700 Torr. This Ar gas, removing silicon oxides and other dust through a filter or the like in exhaust, can be recycled.

The subsidiary chamber 3 is a loading subsidiary chamber for loading each substrate. The subsidiary chamber 4 is an unloading subsidiary chamber for unloading the substrate 11 to which silicon 5 is bonded from the main chamber 1. The loading subsidiary chamber and the unloading subsidiary chamber are positioned to be opposed to each other through the crucible 2, thereby simplifying the flow of the substrates. However, the subsidiary chambers may not necessarily be opposed to each other through the crucible. The two subsidiary chambers may be arranged on the side of the same wall of the main chamber depending on the structure or the shape of a dipping mechanism described later. In this case, it is not necessary to provide two subsidiary chambers but a single subsidiary chamber may be provided with an introduction line and a discharge line. The atmospheres of the subsidiary chambers are set to negative pressure in the same atmosphere as the main chamber, i.e., the inert gas atmosphere.

A thin plate manufacturing method is now described. When the main chamber 1 is in operation, an airtight door 21 is opened for introducing each substrate 11 into the subsidiary chamber 3 while closing another airtight door 23 between the subsidiary chamber 3 and the main chamber. Then, the airtight door 21 is closed, the subsidiary chamber 3 is evacuated, thereafter Ar gas is introduced and the atmosphere of the subsidiary chamber 3 is equalized with that of the main chamber by equalizing the pressure with that in the main chamber 1. Thereafter the airtight door 23 between the subsidiary chamber and the main chamber 1 is opened along the operation of the dipping mechanism in the main chamber, for loading the substrate 11 into the main chamber.

In the main chamber, the dipping mechanism 30 grasps the substrate 11 and transfers the same onto the crucible 2. Then, the dipping mechanism lowers the substrate 11, dips the surface layer part of the substrate 11 in the silicon melt 7 and forms a silicon thin plate on the surface of the substrate 11. Thereafter the substrate 11 to which the silicon thin plate is bonded rises and separates from the crucible 2. While the substrate is dipped in the melt, the bonded silicon melt is cooled so that a solid phase grows to form a prescribed silicon thin plate.

The substrate 11 formed with the silicon thin plate is unloaded into the unloading subsidiary chamber 4 through the airtight door 23 opened after confirming that the airtight door 21 of the subsidiary chamber 4 is closed and the atmosphere of the subsidiary chamber is identical to that of the main chamber. Thereafter the substrate 11 formed with the silicon thin plate is discharged through the airtight door 21 while the airtight door 23 is closed. In order to cool the silicon thin plate formed on the surface of the substrate 11, a cooling apparatus accelerating cooling may be provided on at least one portion in the main chamber 1, the subsidiary chamber 4 or the exterior for cooling the substrate to which silicon is bonded with the cooling apparatus. There is a method of setting a cooling plate with cooling water as the simplest cooling apparatus for bringing the substrate into contact therewith for out-heating/cooling the same.

Figure 2:
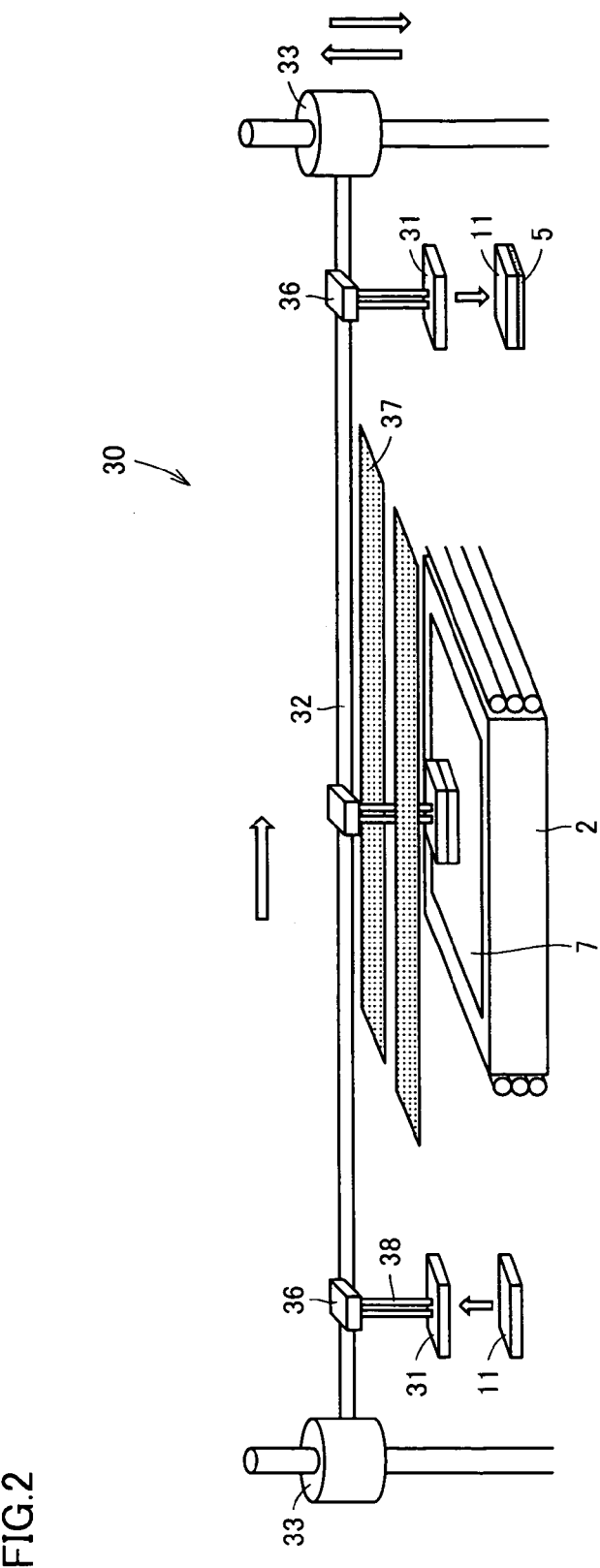
FIG. 2 is a diagram showing an exemplary dipping mechanism of the thin plate manufacturing apparatus shown in FIG. 1.
Figure 3:
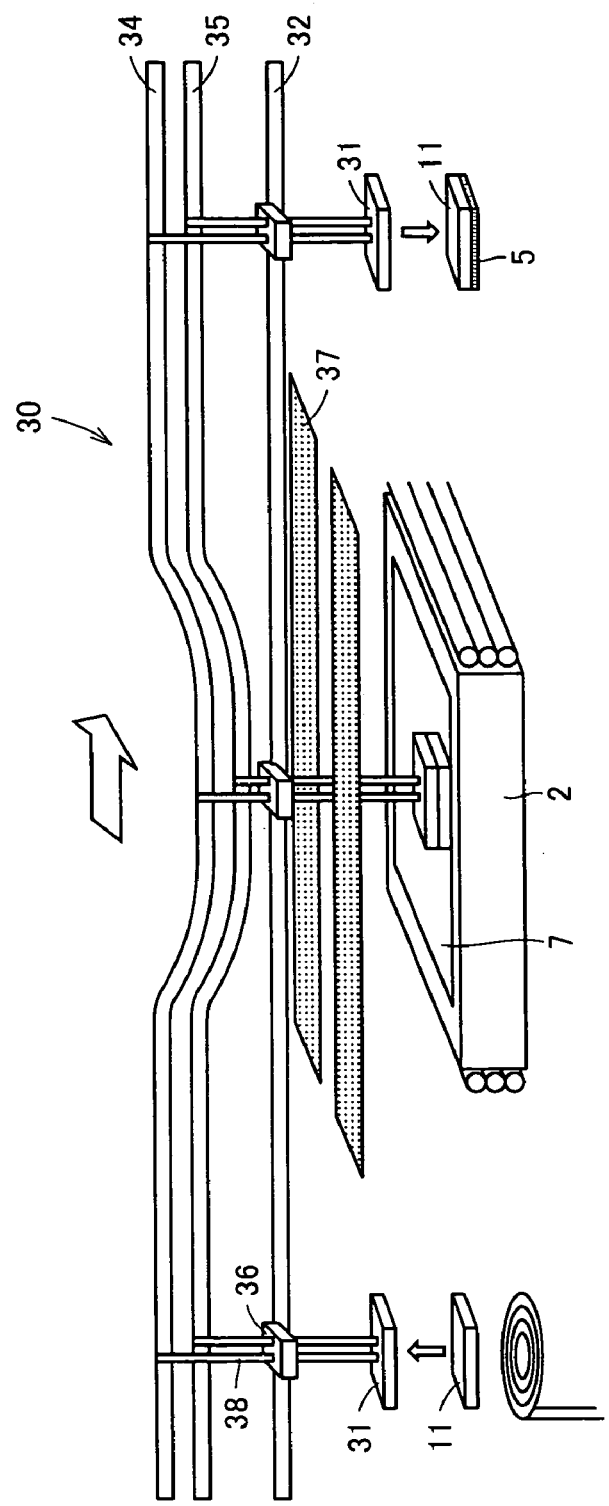
FIG. 3 is a diagram showing another exemplary dipping mechanism of the thin plate manufacturing apparatus shown in FIG. 1.

Any mechanism may be employed for the dipping mechanism 30 transferring the substrate 11 and dipping the same into the silicon melt 7 in the main chamber 1. FIGS. 2 and 3 illustrate some dipping mechanisms. The dipping mechanism shown in FIG. 2 makes supporting plates 36 travel along a rail 32 for performing horizontal transfer. The dipping mechanism performs vertical transfer by vertically moving lifting units 33 supporting the rail 32 and vertically moving along poles.

Each substrate 11 is mounted on a pedestal 31 coupled to each supporting plate 36 by a rod 38, and moves along traveling of the supporting plate 36 on the rail 32. The lifting units 33 move down on the silicon melt 7 in the crucible 2 thereby moving down the supporting plate 36, the rod 38, the pedestal 31 and the substrate 11 along with the rail 32 and dipping the surface layer part of the substrate into the silicon melt. Consequently, silicon is bonded to the surface of the substrate. Thereafter the lifting units 33 rise so that the substrate separates from the silicon melt. At this time, the horizontal movement, the vertical operation and the operation of inclining the substrate are performed by control mechanisms independent of each other. Consequently, the substrate can enter the melt, move in the melt and escape from the melt along an arbitrary orbit and in an arbitrary inclined state. At this time, a personal computer generally programs a horizontal movement command, a vertical operation/movement command and an inclination operation command respectively and transmits the same to controllers thereby implementing an arbitrarily orbit as programmed. Further, the substrate to which silicon is bonded performs horizontal motion after escaping from the melt, and is demounted from the pedestal on a position separating from the crucible. Since the silicon melt is at a high temperature of 1400 to 1500° C. and silicon is evaporated, an adiabatic or cooled screen 37 is arranged on the crucible in order to protect the dipping mechanism such as the rail. The aforementioned horizontal movement, the vertical operation movement and the inclination movement are individually driven by three motors in total allocated to these operations respectively. The aforementioned program controls the aforementioned three independent movements (operations) so that a silicon thin plate of a prescribed thickness is obtained in correspondence to (a) fluctuation of the level of the melt and (a2) fluctuation of the thickness of the substrate.

The dipping mechanism shown n FIG. 3 makes each supporting plate 36 having a guide hole travel along a rail 32. Vertically moving rails 34 and 35 form shallow U-shaped orbits on the crucible so that a pedestal approaches the silicon melt on the silicon melt 7. The upper end of each rod 38 is travelably mounted on the rails 34 and 35.

The substrate 11 is mounted on the pedestal 31, and made to travel along the rails 32, 34 and 35. When approaching the crucible, the rails 34 and 35 take orbits approaching the silicon melt along smooth arcs. At this time, the rod approaches the silicon melt through the guide hole provided in the supporting plate 36, for consequently dipping the surface layer part of the substrate 11 into the silicon melt. Thereafter the rails 34 and 35 take rising orbits. A subsequent movement is similar to that in the case of FIG. 2.

According to this embodiment, the quantity of oxygen or the like penetrating into the main chamber following loading and unloading of substrates can be reduced when manufacturing silicon thin plates in a mass production scale. Therefore, formation of oxides in the silicon melt in the crucible can be so suppressed that the quality of the produced silicon thin plates can be ensured and the manufacturing yield can be further improved. Further, silicon evaporating from the crucible so hardly forms oxides that maintenance itself can be simplified. In addition, durability of various types of devices in the main chamber can be improved.

Second Embodiment

Figure 4:
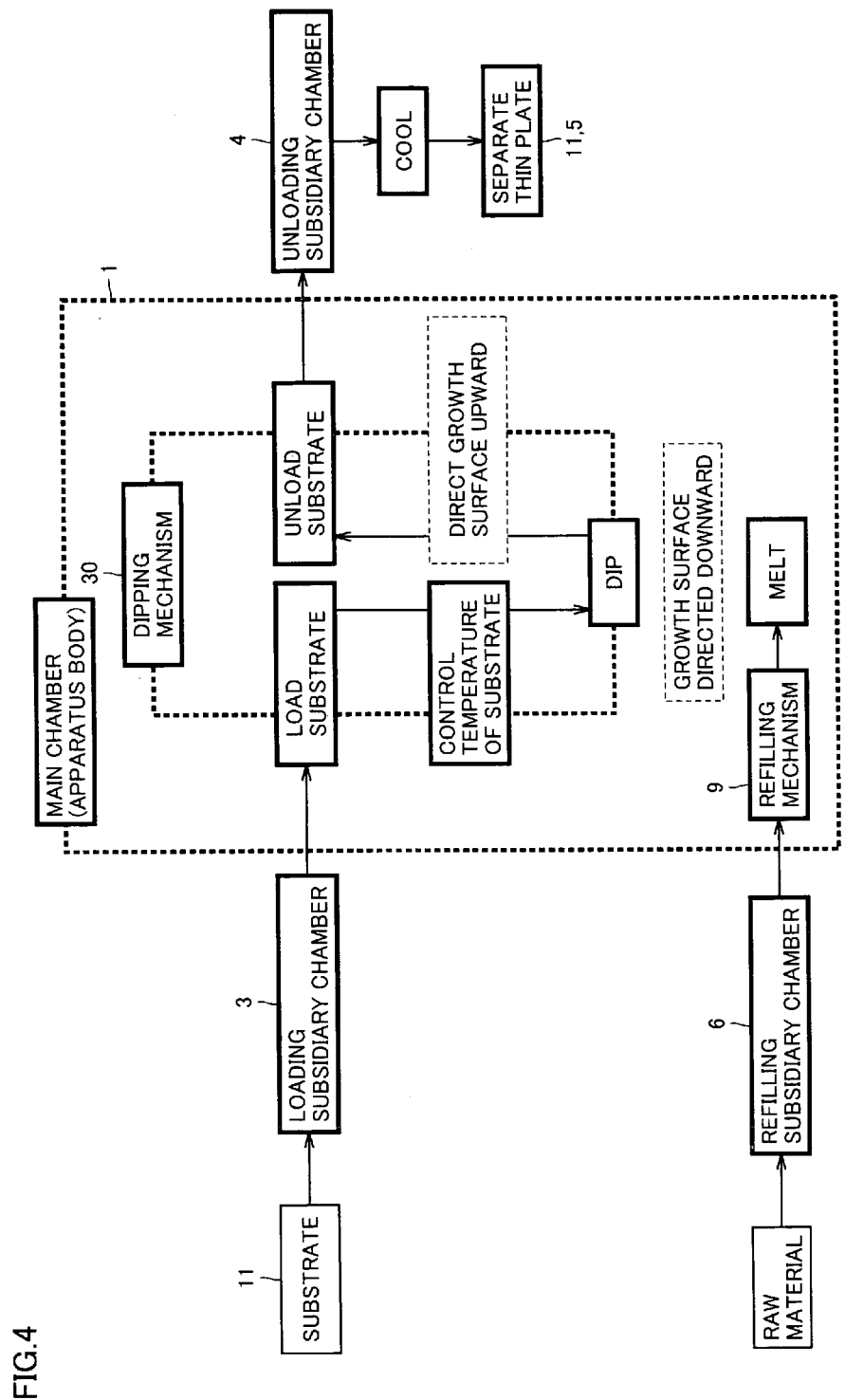
FIG. 4 is a diagram showing a thin plate manufacturing apparatus according to a second embodiment of the present invention.

FIG. 4 is a diagram illustrating the flow of thin plate manufacturing in a second embodiment of the present invention. Referring to FIG. 4, a substrate 11 is introduced into a main chamber (apparatus body) 1 through a loading subsidiary chamber 3, and placed on a mounting position of a dipping mechanism 30. The substrate mounted on the dipping mechanism is temperature-controlled, and the surface layer part thereof is dipped into a silicon melt. At this time, the substrate is dipped in the silicon melt while facing the surface on which a silicon thin plate is grown toward the silicon melt. In other words, the substrate is dipped while directing a crystal growth surface downward. After the substrate is pulled up from the dipping position, the crystal growth surface of the substrate is directed upward so that the formed silicon thin plate does not fall from the substrate by gravity. Further, the substrate is placed on a demounting position for demounting the same from the dipping mechanism while carrying the silicon thin plate. Thereafter the substrate carrying the silicon thin plate is unloaded into an unloading subsidiary chamber 4. Thereafter the silicon thin plate is cooled and separated from the substrate.

Following the aforementioned manufacturing of the silicon thin plate, the quantity of the silicon melt in the crucible is reduced. In order to compensate this, a silicon raw material is refilled. Therefore, a refilling subsidiary chamber 6 is provided adjacently to the main chamber for loading the raw material into a refilling mechanism such as a refilling crucible 9, for example, through the refilling subsidiary chamber and preparing a silicon melt. The refilling mechanism refills this silicon melt in the crucible, for supplementing the silicon melt. An adiabatic chute or the like for feeding the silicon melt into the crucible from the refilling crucible can be employed for the refilling mechanism, not to hinder the movement of the substrate around the crucible. This refilling mechanism can hold the level of the silicon melt in a prescribed fluctuation range, for example.

The aforementioned loading subsidiary chamber 3, the unloading subsidiary chamber 4 and the refilling subsidiary chamber 6 comprise airtight doors between the same and the main chamber as well as the exterior. Further, inert gas is introduced into the main chamber as well as the aforementioned loading subsidiary chamber, the unloading subsidiary chamber and the refilling subsidiary chamber for maintaining the same at prescribed pressure. The atmosphere pressure of the main chamber and those of the respective subsidiary chambers are substantially equalized with each other. However, the pressure of the main chamber and those of the subsidiary chambers may be different from each other within a prescribed range.

Penetration of gas such as oxygen exerting bad influence on manufacturing of silicon thin plates can be suppressed in mass production by employing three subsidiary chambers as described above. Consequently, influence exerted on the operation can be suppressed by stably coping with an unexpected situation.

Third Embodiment

Figure 5:
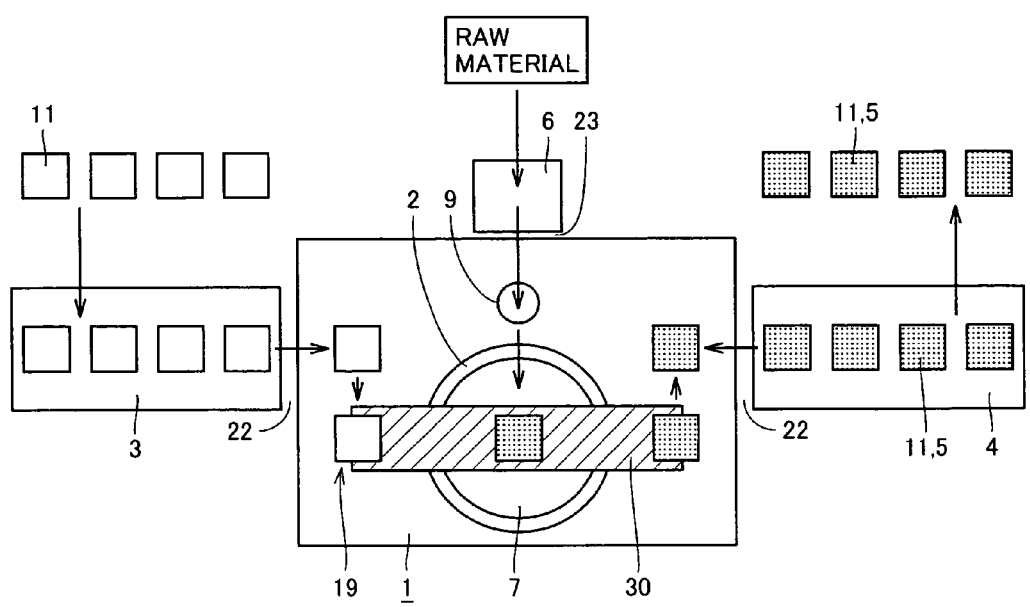
FIG. 5 is a diagram showing a thin plate manufacturing apparatus according to a third embodiment of the present invention.

FIG. 5 is a diagram showing a thin plate manufacturing apparatus according to a third embodiment of the present invention. The thin plate manufacturing apparatus shown in FIG. 5 is characterized in that substrates flow in a constant direction for manufacturing silicon thin plates. A loading subsidiary chamber 3 is provided on one side of a main chamber 1, while an unloading subsidiary chamber 4 is provided on a position opposite thereto through the main chamber. Gate valves 22 are arranged between the subsidiary chambers 3 and 4 and the main chamber, for ensuring airtightness in the main chamber.

A refilling subsidiary chamber 6 is also provided on the main chamber 1 for ensuring stability of the atmosphere in the main chamber in loading of a raw material along with an airtight door 23 arranged between the same and the main chamber. The loaded raw material is introduced into a refilling crucible and melted, to be refilled into a crucible 7.

The schematic flow of manufacturing silicon thin plates is as follows: First, substrates 11 are externally introduced into the loading subsidiary chamber. The substrates may be introduced one by one or in plural. In the thin plate manufacturing apparatus shown in FIG. 5, the substrates 11 are loaded one by one from the loading subsidiary chamber 3 into the main chamber 1 through the gate valve 22. In the main chamber, each substrate is mounted on a dipping mechanism 30 on a mounting position 19. The dipping mechanism 30 transfers the substrate 11 toward a silicon melt 7 from one side and dips the same in the silicon melt. Thereafter the substrate to which a silicon thin plate is bonded is demounted from the dipping mechanism and unloaded into the unloading subsidiary chamber 4 arranged on the other side through the gate valve 22. The dipping mechanism returns to the mounting position 19 for the substrate during this time. The unloading subsidiary chamber holds a prescribed number of substrates 11 formed with silicon thin plates 5, and discharges the substrates from the apparatus after the same reach the prescribed number.

Figure 6:
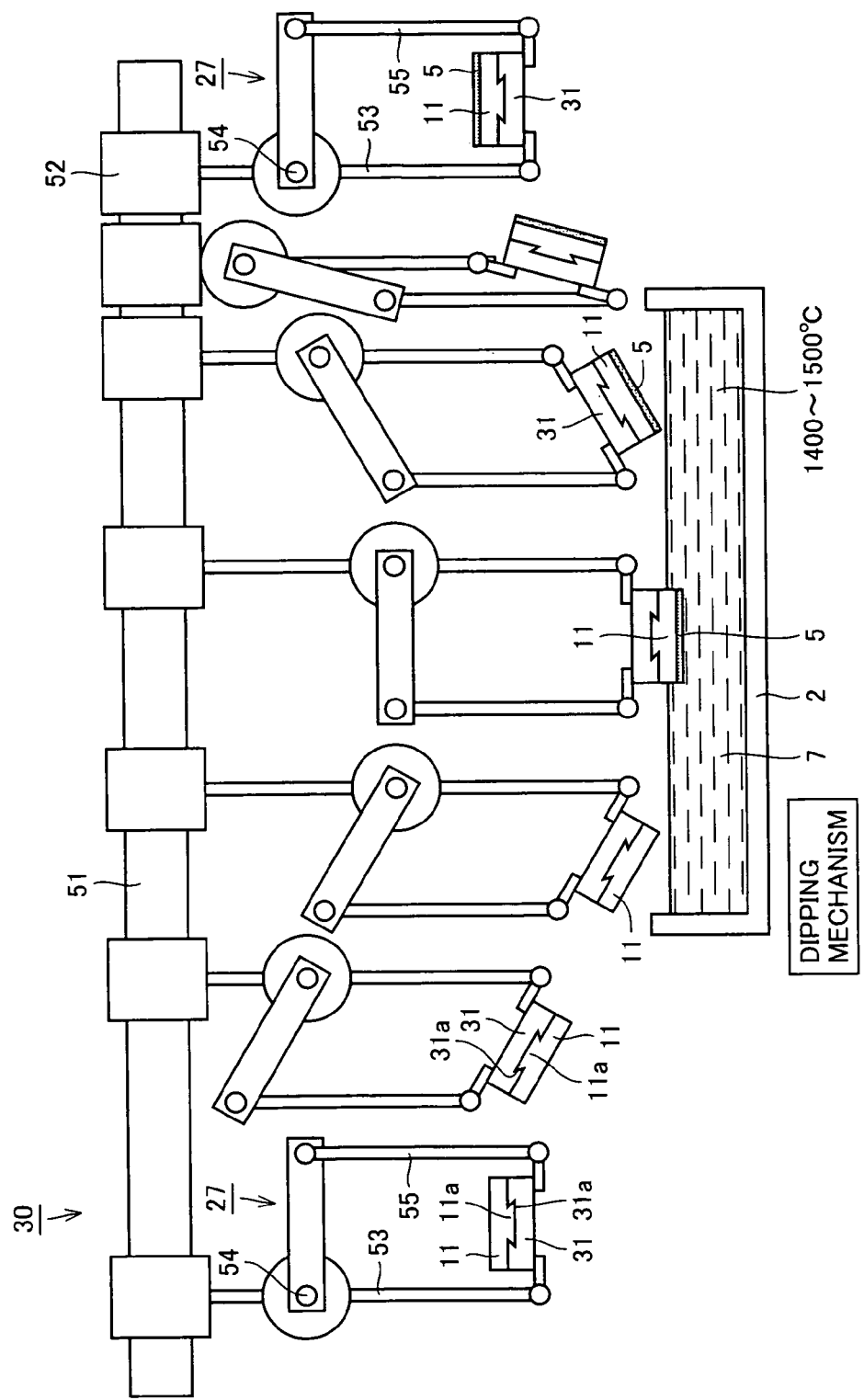
FIG. 6 is a diagram showing a dipping mechanism of the thin plate manufacturing apparatus shown in FIG. 5.

FIG. 6 illustrates the aforementioned dipping mechanism in detail. This dipping mechanism 30 comprises vertically moving mechanisms 52 traveling along a transverse shaft 51, and substrate holders 27 are suspended from the vertically moving mechanisms. Each substrate holder 27 comprises a rotary support 55 rotated by a rotation mechanism 54 and a suspension support 53. A pedestal 31 is supported between the rotary support 55 and the suspension support 53. The pedestal 31 has an engaging groove 31a engaging with each substrate at the central portion. Each substrate 11 shown in FIG. 6 has a ridgy projection 11a on the back surface thereof so that the ridgy projection 11a and the engaging groove 31a of the pedestal engage with each other to be integrated with each other.

The substrate 11 loaded into the main chamber is mounted on the dipping mechanism 30 on the substrate mounting position. In the substrate holder 27 located on the left end in FIG. 6, the pedestal 31 engages with the substrate. The rotary support 55 is located in front of the suspension support 53, and the position for supporting the pedestal is also located in front. As the vertically moving mechanism 52 travels rightward, the rotation mechanism 54 rotates to locate the rotary support 55 leftward beyond the suspension support 53. According to this rotation, the pedestal 31 is located above the substrate 11. Consequently, a crystal growth surface of the substrate faces the silicon melt 7. Thereafter the surface layer part of the substrate is dipped in the silicon melt, for growing a silicon crystal on the crystal growth surface. After the substrate is pulled up from the silicon melt, the rotation mechanism 54 rotates again for locating the substrate above the pedestal. At this time, the crystal growth surface of the substrate is directed upward.

The silicon thin plate can be prevented from falling from the substrate by employing the aforementioned dipping mechanism.

Figure 7:
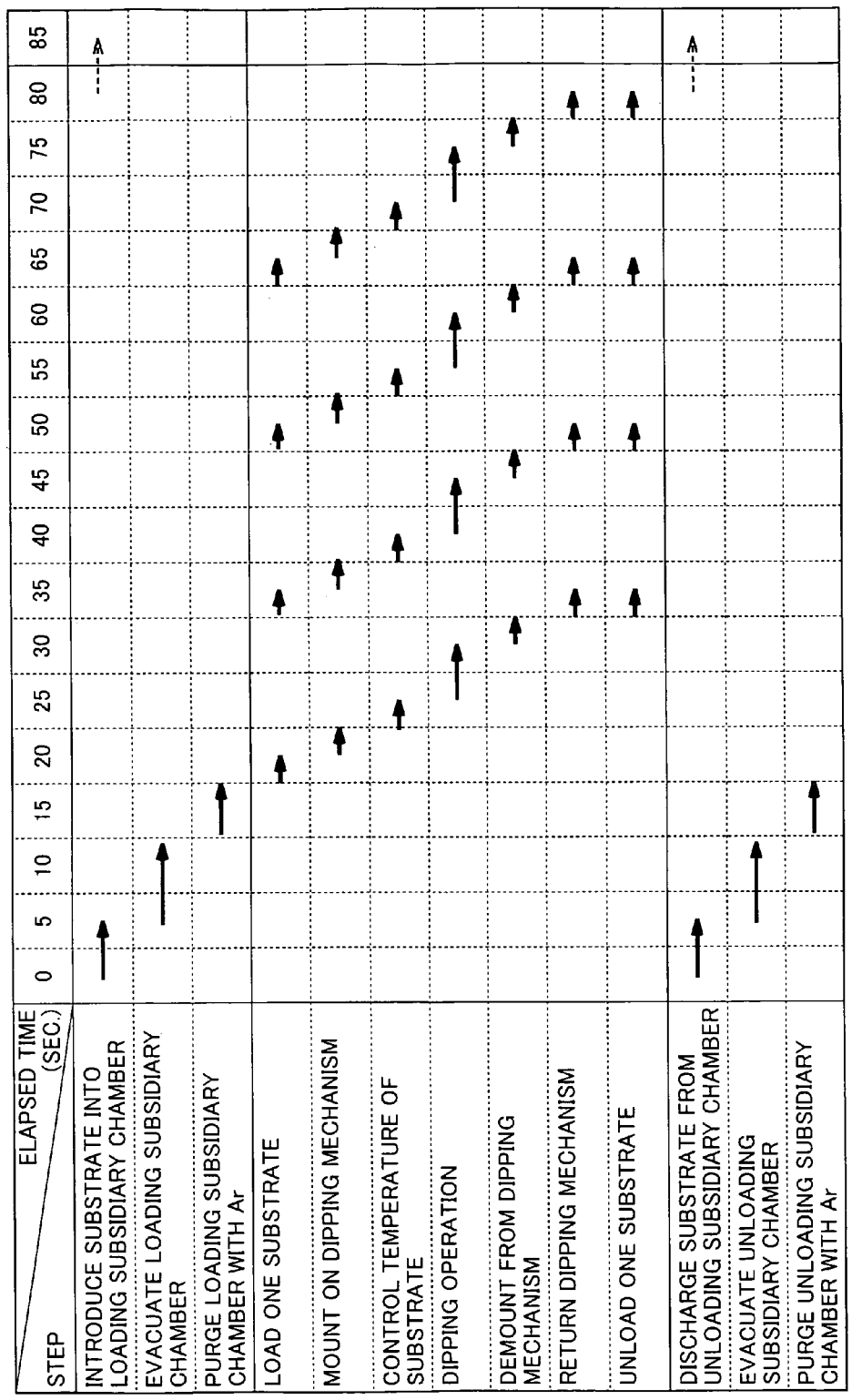
FIG. 7 is a diagram showing the time series of thin plate manufacturing with the thin plate manufacturing apparatus shown in FIG. 5.

The time series of the aforementioned thin plate manufacturing is now described with reference to FIG. 7. FIG. 7 describes the thin plate manufacturing flow at intervals of 5 seconds. First, four substrates are combinedly introduced into the loading subsidiary chamber. Then, the loading subsidiary chamber is evacuated. Thereafter the loading subsidiary chamber is purged with argon gas. The treatment up to this stage is performed on the loading subsidiary chamber in common for the four substrates. At this time, the unloading subsidiary chamber is also subjected to evacuation and argon gas purge.

Thereafter one of the substrates is transported into the main chamber and mounted on the dipping mechanism. The substrate is temperature-controlled, thereafter dipped in the silicon melt, and pulled up. Then, the substrate is unloaded from the dipping mechanism. Thereafter the second substrate is transported from the loading subsidiary chamber into the main chamber while returning the dipping mechanism to the original mounting position. At this time, the first substrate formed with a silicon thin plate is unloaded into the unloading subsidiary chamber and held therein. The second to fourth substrates are transported into the main chamber and repetitively subjected to the same treatment as that for the first substrate, and the unloading subsidiary chamber holds the for substrates formed with silicon thin plates when the fourth substrate is unloaded into the unloading subsidiary chamber.

These four substrates formed with the silicon thin plates are simultaneously unloaded from the unloading subsidiary chamber. At this time, a time reaching about 80 seconds has elapsed from the point when the four substrates have been first introduced into the loading subsidiary chamber. When simultaneously introducing the four substrates into the loading subsidiary chamber, dipping the same one by one and simultaneously unloading the four substrates, therefore, the stroke (cycle time) is 80 seconds and it follows that a treatment time of 20 seconds is required per substrate.

In the manufacturing method according to this embodiment, the substrates are loaded from the loading subsidiary chamber into the main chamber and unloaded from the main chamber into the unloading subsidiary chamber independently of each other. Therefore, the mechanisms for loading and unloading can be so simplified that reliability of the mechanisms of the thin film manufacturing apparatus can be improved.

Fourth Embodiment

Figure 8:
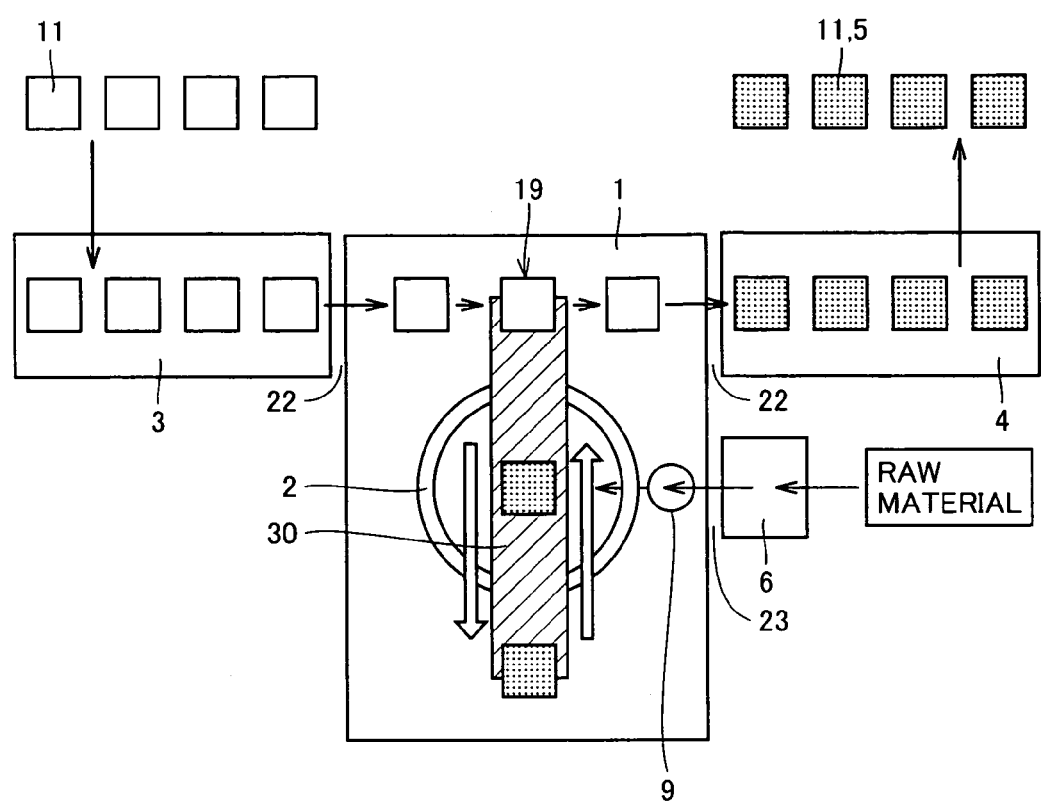
FIG. 8 is a diagram showing a thin plate manufacturing apparatus according to a fourth embodiment of the present invention.

FIG. 8 is a diagram showing a thin plate manufacturing apparatus according to a fourth embodiment of the present invention. This embodiment is characterized in that a direction for transferring substrates by a dipping mechanism and a direction from a loading subsidiary chamber toward an unloading subsidiary chamber intersect with each other. The dipping mechanism transfers each mounted substrate onto a crucible, dips the same into a silicon melt, and thereafter returns to an original mounting position 19. The apparatus mounts a new substrate on the dipping mechanism while demounting the substrate formed with a silicon thin plate. Consequently, the time can be reduced as compared with a case of separately performing mounting and demounting of each substrate.

Figure 9:
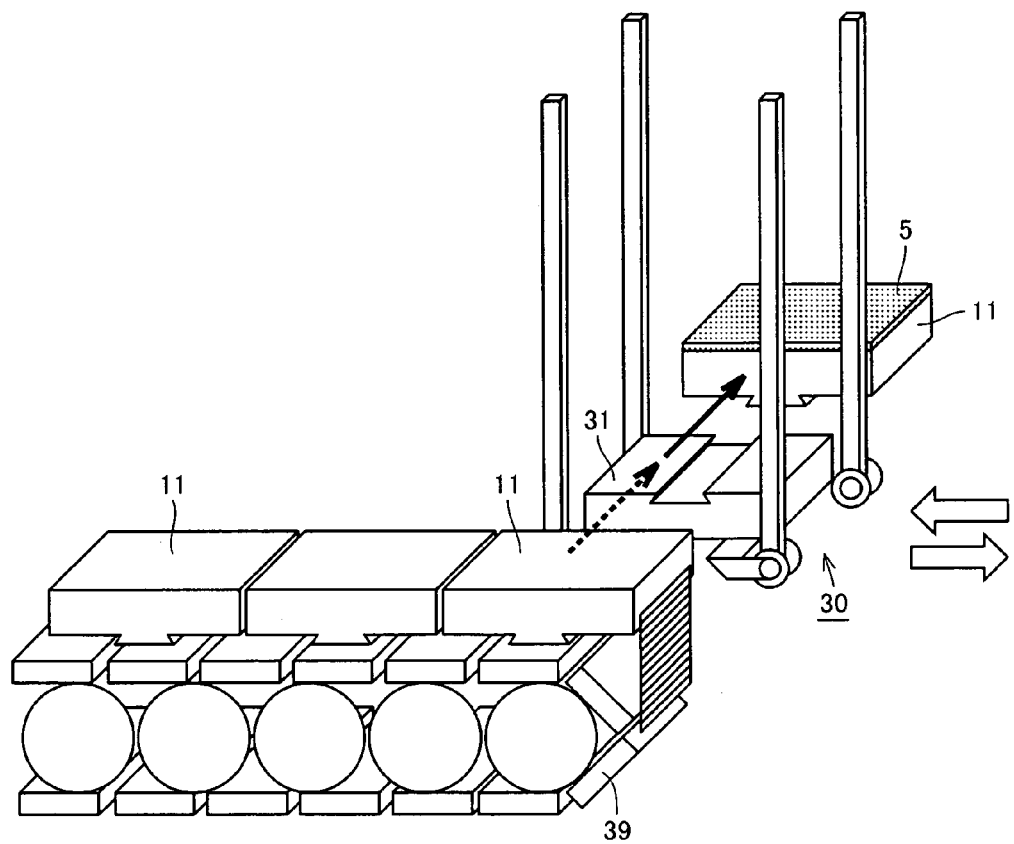
FIG. 9 is a diagram showing a dipping mechanism of the thin plate manufacturing apparatus shown in FIG. 8.

An apparatus capable of parallelly mounting and demounting the substrates on and from the dipping mechanism as described above is implemented by a substrate mounting/demounting mechanism shown in FIG. 9, for example. Referring to FIG. 9, a substrate formed with a silicon thin plate has returned to the mounting position 19. A ridgy projection provided on the back surface of the substrate 11 formed with the silicon thin plate is engaged into an engaging groove of a pedestal 31 for mounting the substrate on the pedestal. A substrate transferor 39 arranged in a main chamber transfers substrates 11 to the substrate mounting position 19. The substrates 111 of the substrate transferor and the substrate formed with the silicon thin plate are flush with each other, and the substrate transferor engages a new substrate in the extensional direction of the engaging groove of the pedestal 31. At this time, the substrate formed with the silicon thin plate is extruded by the new substrate and demounted from the dipping mechanism. In this case, the positions for mounting and demounting the substrates respectively are adjacent to each other or substantially identical to each other. Therefore, the mounting position 19 also expresses the demounting position.

Figure 10:
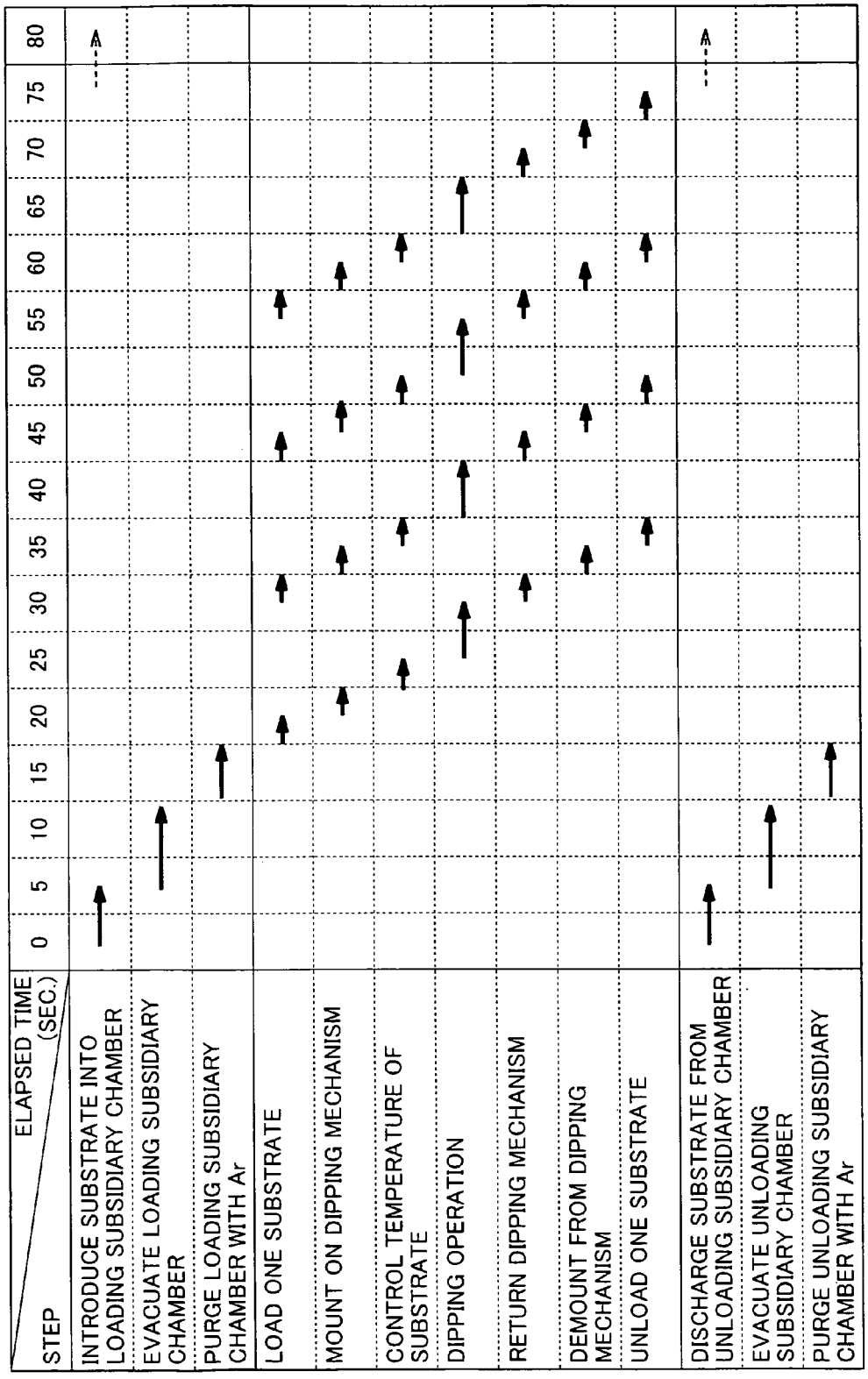
FIG. 10 is a diagram showing the time series of thin plate manufacturing with the thin plate manufacturing apparatus shown in FIG. 8.

FIG. 10 illustrates the time series of the aforementioned thin plate manufacturing. This manufacturing flow is identical to the manufacturing flow of FIG. 7 for the most part. The difference resides in that the apparatus demounts the substrate from the dipping mechanism, then returns the dipping mechanism to the original mounting position and thereafter mounts the second substrate on the dipping mechanism in the flow shown in FIG. 7 while the apparatus simultaneously and parallelly mounts and demounts the substrates on and from the dipping mechanism in the flow shown in FIG. 10. Therefore, time reduction can be implemented. In other words, the apparatus can simultaneously and parallelly mount the second substrate on the dipping mechanism and demount the first substrate from the dipping mechanism in the column of the elapsed time of 35 seconds shown in FIG. 10. Therefore, the apparatus can reduce the stroke for manufacturing four silicon thin plates to 75 seconds. This corresponds to a time of 19 seconds per silicon thin plate, and the stroke can be reduced by 1 second per thin plate as compared with the manufacturing flow shown in FIG. 7. Consequently, the manufacturing efficiency can be increased and the manufacturing cost can be reduced in the field of solar cells etc. where the manufacturing cost is of great importance.

Fifth Embodiment

Figure 11:
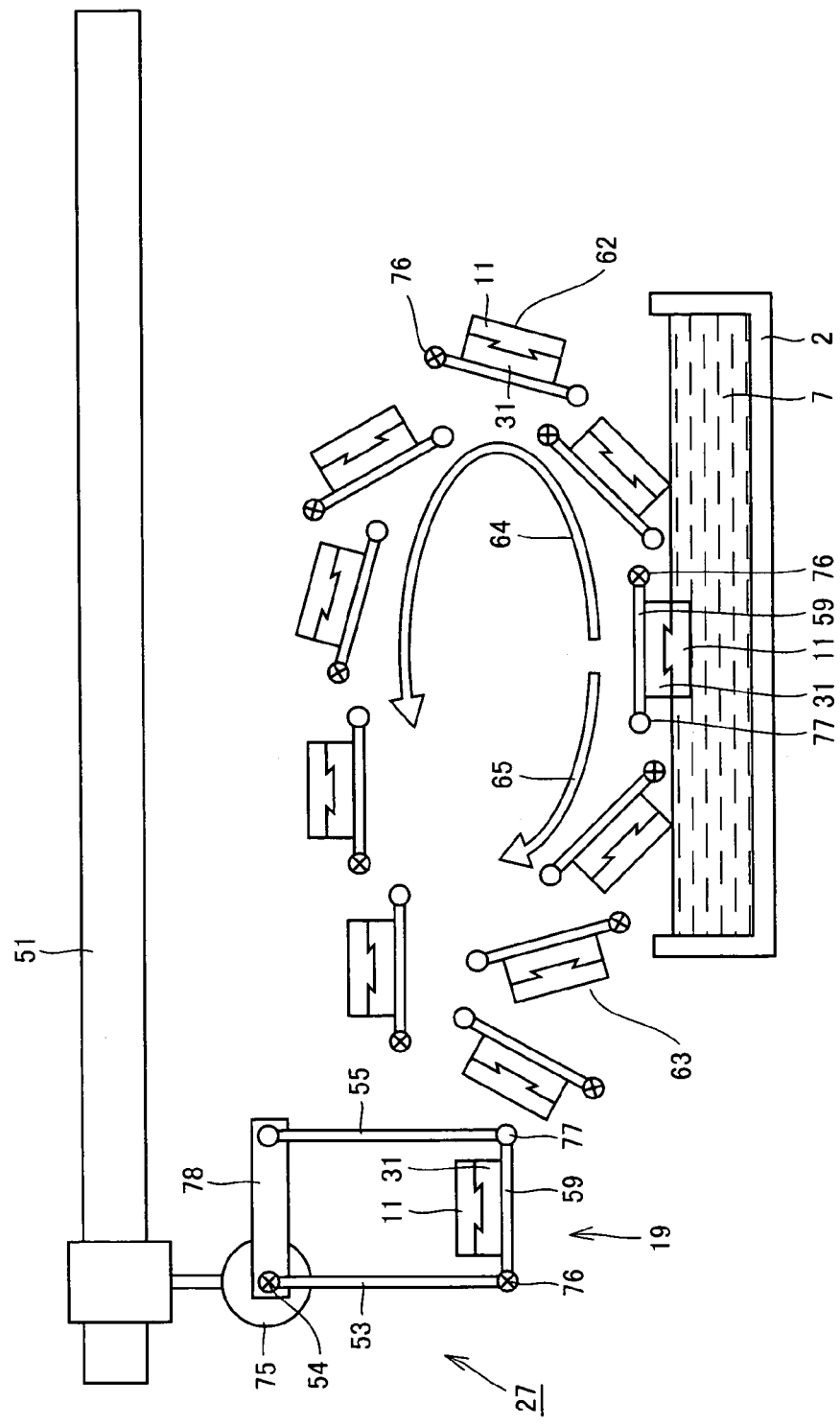
FIG. 11 is a diagram showing a dipping mechanism in a thin plate manufacturing apparatus according to a fifth embodiment of the present invention.

FIG. 11 is a diagram showing operations of a dipping mechanism in a thin film manufacturing apparatus according to a fifth embodiment of the present invention. All of arrangement of an insertion subsidiary chamber, an unloading subsidiary chamber and the dipping mechanism and the flow of substrates are identical to those in the fourth embodiment. According to this embodiment, each substrate is moved from a mounting/demounting position 19 for mounting and demounting the substrate toward a crucible and dipped therein for growing a thin plate, as shown in FIG. 8 of the fourth embodiment. Thereafter the dipping mechanism returns the substrate to the mounting/demounting position 19 and demounts the substrate. The series of operations of the dipping mechanism are described.

A substrate holder 27 travels along a transverse shaft 51 and makes the substrate perform a vertical movement, a horizontal movement and a rotational movement. A fulcrum 76 is present on an end of a suspension support 53. A pedestal support member 59 fixing a pedestal 31 is rotatably mounted on the fulcrum 76, and the pedestal 31 for engaging with the substrate is connected to the pedestal support member. The pedestal support member 59 is connected to couple a power point 77 located on an end of a rotary support 55 with the fulcrum 76. Rotation mechanisms 54 and 75 are present on an upper portion of the suspension support 53, to support the rotary support 55 through a rotary arm 78. It is possible to rotate the substrate by rotating the rotation mechanisms 54 and 75. The pedestal support member is rotatably mounted on the supporting point as well as on the power point.

Referring to FIG. 11, it follows that the dipping operation takes either one of the following directions of movement (revolution orbits): A revolution orbit of an anticlockwise direction 64 or a clockwise direction 65 on the plane of FIG. 11. The dipping operation along the revolution orbit in the anticlockwise direction 64 is in a cycle of the following repetitive operations:

(1) To mount the substrate 11 on the substrate mounting/demounting position 19.

(2a) To move the substrate 11 to a pre-dipping position (position 63 in this case).

(3a) To dip the substrate 11 and move the same to a post-dipping position (position 62 in this case).

(4a) To return the substrate 11 from the post-dipping position to the substrate mounting/demounting position 19.

(5) To demount the substrate 11 to which a thin plate is bonded.

In the case of the anticlockwise direction 64, the direction of the horizontal operation in the dipping operation is rightward in FIG. 11, oppositely to the aforementioned return operation (4a).

On the other hand, the dipping operation in the clockwise direction 65 is in a cycle of the following repetitive operations:

(1) To mount the substrate 11 on the substrate mounting/demounting position 19.

(2b) To move the substrate 11 to a pre-dipping position (position 62 in this case).

(3b) To dip the substrate 11 and move the same to a post-dipping position (position 63 in this case).

(4b) To return the substrate 11 from the post-dipping position to the substrate mounting/demounting position 19.

(5) To demount the substrate 11 to which a thin plate is bonded.

When the revolution orbit is in the clockwise direction 65, the direction of the horizontal operation in the dipping operation is leftward in FIG. 11, identically to the aforementioned direction of the return operation (4b).

As shown in the above, the pre-dipping positions and the post-dipping positions are replaced with each other in the revolution orbits along the anticlockwise direction 64 and the clockwise direction 65. The angle of inclination of the surface of the substrate with respect to the level of a melt on the pre-dipping and post-dipping positions is set to ±80° in this embodiment.

Figure 12:
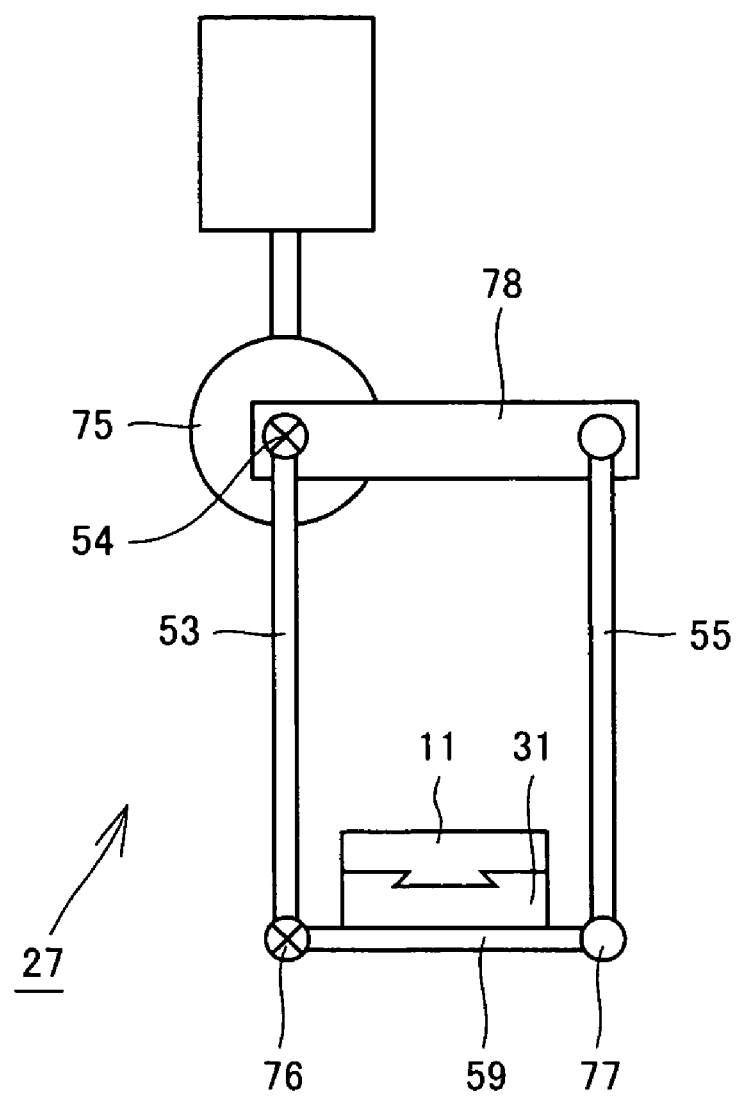
FIG. 12 illustrates a substrate holder.

FIG. 12 is a diagram illustrating the substrate holder 27 traveling along the transverse shaft 51 in detail. The fulcrum 76 is present on the end of the suspension support 53. The pedestal support member 59 is connected to couple the power point 77 located on the end of the rotary support 55 with the fulcrum 76. The pedestal 31 engaging with the substrate 11 is connected to the pedestal support member 59. The rotation mechanisms 54 and 75 are present on the upper portion of the suspension support 53 for supporting the rotary support 55 through the rotation arm 78. It is possible to rotate the substrate 11 by rotating the rotation mechanisms 54 and 75.

The simplest structure is a structure providing through shafts on the supporting point and the power point. According to this method, however, the through shafts and the support physically interfere with each other and hence it is impossible to rotate the substrate by 360°. Assuming that the substrate is at an angle of rotation of 0° when the surface thereof is directed immediately downward and the clockwise direction of rotation in the dipping mechanism is the positive direction, for example, it follows that the through shaft of the power point 77 and the suspension support 53 collide with each other at an angle of about +90°. Therefore, the substrate rotation range is up to 80° in the positive direction and up to −260° in the negative direction. The positive direction and the negative direction of rotation are the directions of rotation of the dipping mechanism. Description is made distinguishably from arrows 64 and 65 in FIG. 11 indicating revolution of the dipping mechanism. On the other hand, it is possible to avoid interference with the support by providing no through shaft at least either on the supporting point or on the power point. In this case, the substrate is rotatable by 360°. However, the structure is complicated to deteriorate the cost and durability.

Operations of the dipping mechanism incapable of rotating the substrate by 360° are described. In this case, it is impossible to pass through +90° as described above. When dipping the substrate through the revolution orbit along arrow 64 in FIG. 11, it is necessary to rotate the substrate clockwise by 260° in total from upward rotation (angle of rotation=−180°) up to +80° while moving from the substrate mounting/demounting position 19 to the pre-dipping position 63. In other words, the substrate cannot take the minimum angle of rotation but takes the attitude at the pre-dipping position 63 by inversely rotating in a detouring manner. Thereafter the substrate is dipped while rotating anticlockwise, and rotates by 100° in total up to −180° while returning from the post-dipping position 62 to the substrate mounting/demounting position 19.

When dipped through the revolution orbit along arrow 65 in FIG. 11, the substrate must rotate clockwise by 100° in total from upward rotation (angle of rotation=−180°) up to −80° while moving from the substrate mounting/demounting position 19 to the pre-dipping position 62. Thereafter the substrate subjected to dipping must rotate anticlockwise by 260° in total from the post-dipping position 63 (angle of rotation=+80°) up to −180° while returning to the substrate mounting/demounting position 19.

In each of the aforementioned dipping operations, the substrate not rotating by 360° must be rotated by 260° in either one of the pre-dipping movement and the return movement. When the rotational speed is set to 3000°/min., 5.2 seconds are required for only the rotation, to remarkably deteriorate the stroke. Even if the rotational speed is improved by increasing the power, durability measures are required, the weight of the dipping mechanism is increased and it is necessary to further increase the power, to remarkably increase the apparatus cost.

Operations of the dipping mechanism are described with reference to a case where the substrate is rotatable by 360°. When the substrate is dipped through the revolution orbit along arrow 64 in FIG. 11, the substrate rotates anticlockwise by 100° in total from upward rotation (angle of rotation=−180°) up to +80° while moving from the substrate mounting/demounting position 19 to the pre-dipping position 63. Thereafter the substrate is dipped and rotates by 100° in total up to −180° while returning from the post-dipping position 62 to the substrate mounting/demounting position 19.

When dipped through the revolution orbit along arrow 65 in FIG. 11, the substrate rotates clockwise by 100° in total from upward rotation (angle of rotation=−180°) up to −80° while moving from the substrate mounting/demounting position 19 to the pre-dipping position 62. Thereafter the substrate is dipped and rotates by 100° in total up to −180° while returning from the post-dipping position 63 (angle of rotation=+80°).

In each of the aforementioned dipping operations, it is necessary to rotate the substrate by 100° during the pre-dipping operation or the return operation, in order to rotate the same by 360°. When the rotational speed is set to 3000°/min., rotation is terminated in 2 seconds.

As hereinabove described, the substrate is preferably rendered rotatable by 360° in consideration of the apparatus cost, durability and the stroke.

Thin plate recovery values in cases of manufacturing tin plates along the revolution orbit in the aforementioned clockwise direction 65 (the direction of the dipping operation is identical to the return direction) and along the revolution orbit in the aforementioned anticlockwise direction 64 (the direction of the dipping operation is opposite to the return operation) while equalizing the dipping orbits from the pre-dipping positions to the post-dipping positions and conditions with each other are now described with reference to Table 1.

TABLE 1

| Direction of Horizontal Operation in Dipping Operation | Recovery (%) |
|---|---|
| Identical to Return Direction | 95 |
| Opposite to Return Direction | 92 |

Referring to Table 1, the case of the revolution orbit in the anticlockwise direction 64 (opposite to the return direction in Table 1) is inferior in recovery to the revolution orbit in the clockwise direction 65 (identical to the return direction in Table 1) since the thin plates fall before returning to an exchange position after growth. This is because the direction of the horizontal operation of the substrates is so reversed before the substrates are directed upward that the thin plates are readily displaced from the substrates due to inertial force. In the clockwise case (arrow 65), the substrates regularly press the thin plates in the direction of the horizontal operation thereof, so that the thin plates are hardly displaced from the substrates. Therefore, the direction of the horizontal movement before the dipping operation is preferably identical to the return direction to the substrate mounting/demounting position 19.

Sixth Embodiment

Figure 13:
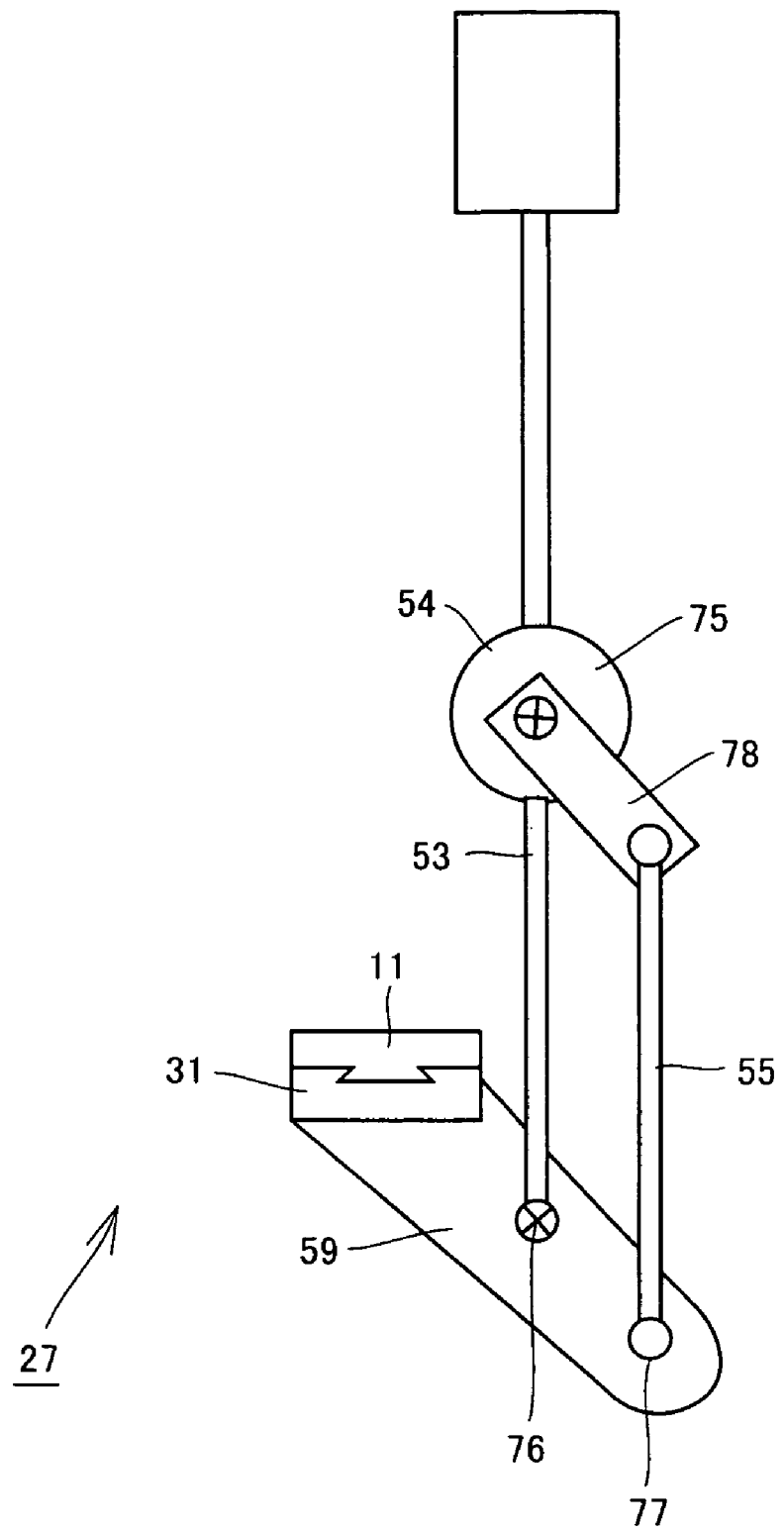
FIG. 13 illustrates another substrate holder.

FIG. 13 is a diagram illustrating a substrate holding part of a dipping mechanism in a thin plate manufacturing method according to a sixth embodiment of the present invention in detail. A fulcrum 76 is present on an end of a suspension support 53. A pedestal 31 engaging with a substrate 11 is connected to the fulcrum 76. With respect to the fulcrum, connection is made to a power point 77 located on an end of a rotation support 55 on the side opposite to the substrate 11. Rotation mechanisms 54 and 75 are present on an upper portion of the suspension support 53 for supporting the rotation support 55 through a rotation arm 78. It is possible to rotate the substrate 11 by rotating the rotation mechanisms 54 and 75.

Figure 14:
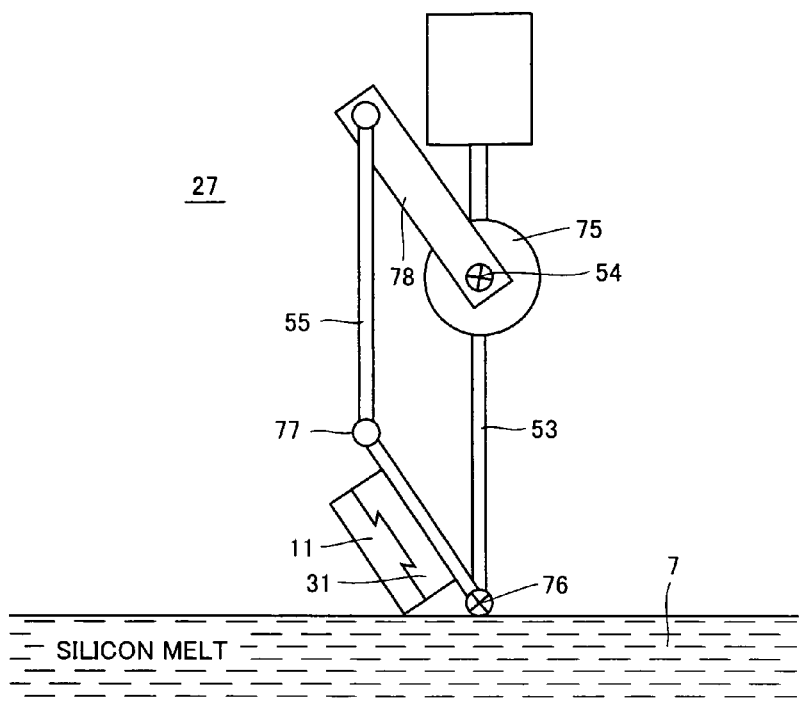
FIG. 14 is a diagram showing a state of using the substrate holder shown in FIG. 12.

When employing the substrate holder 27 shown in FIG. 12, the fulcrum 76 or the power point 77 is dipped in the melt 7 if the dipping operation is performed while inclining the substrate 11, as shown in FIG. 14. Therefore, it is impossible to remarkably incline the substrate 11.

Figure 15:
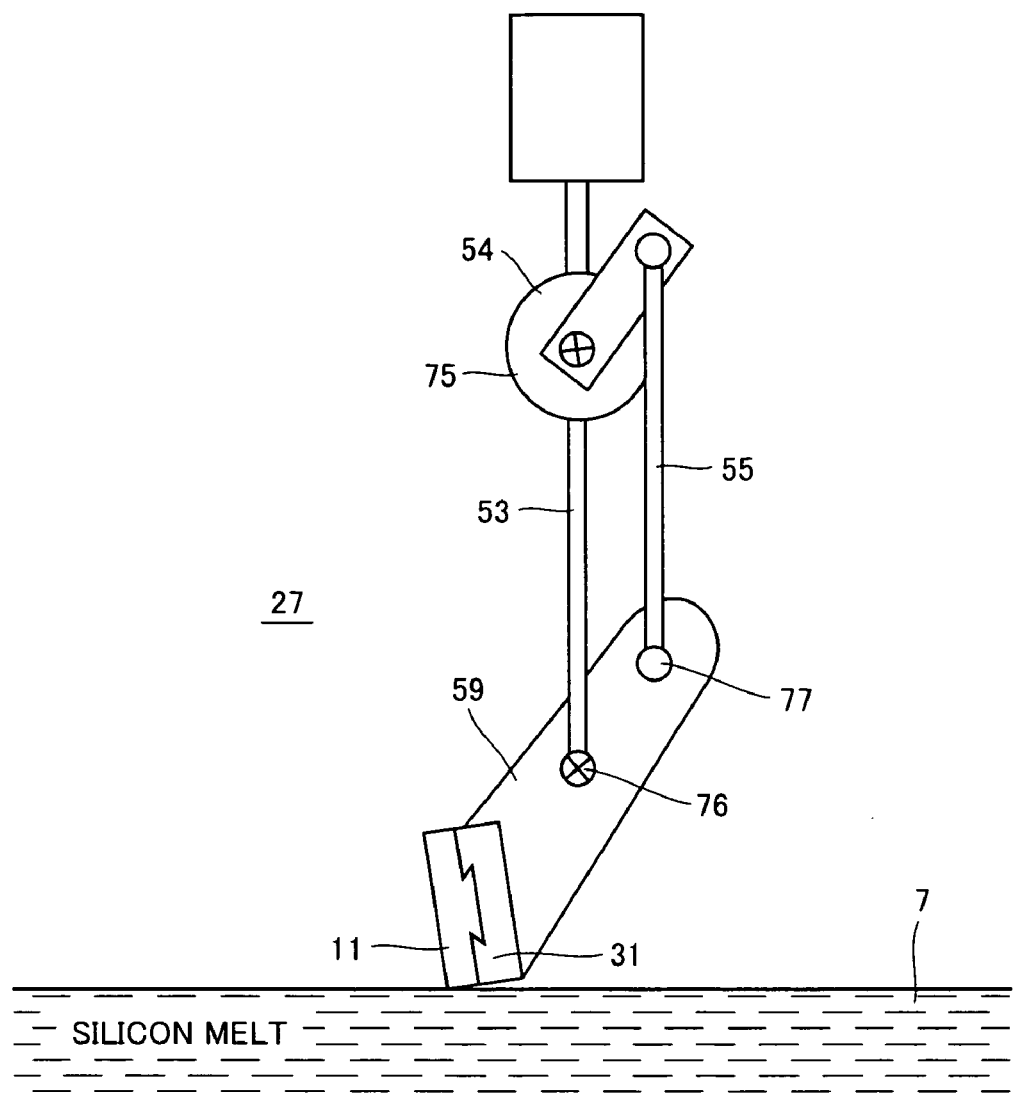
FIG. 15 is a diagram showing a state of using the substrate holder shown in FIG. 13.

When employing the substrate holder shown in FIG. 13, on the other hand, the substrate 11 can be set to a large angle of inclination when entering a melt 7 or escaping from the melt 7, as shown in FIG. 15. Assuming that the substrate is at 0° when the same is directed downward and the clockwise direction is the positive direction, it is also possible to make the substrate escape from the melt in a state of 90°, as shown in FIG. 15. At the time of escape from the melt, a pool of a silicon melt remains on a thin plate when an end of the grown thin plate separates from the melt. This results from surface tension. Therefore, the substrate is so inclined at 90° when the end thereof separates from the melt that the melt is readily drained and the quantity of the remaining pool can be remarkably reduced.

Seventh Embodiment

Figure 16:
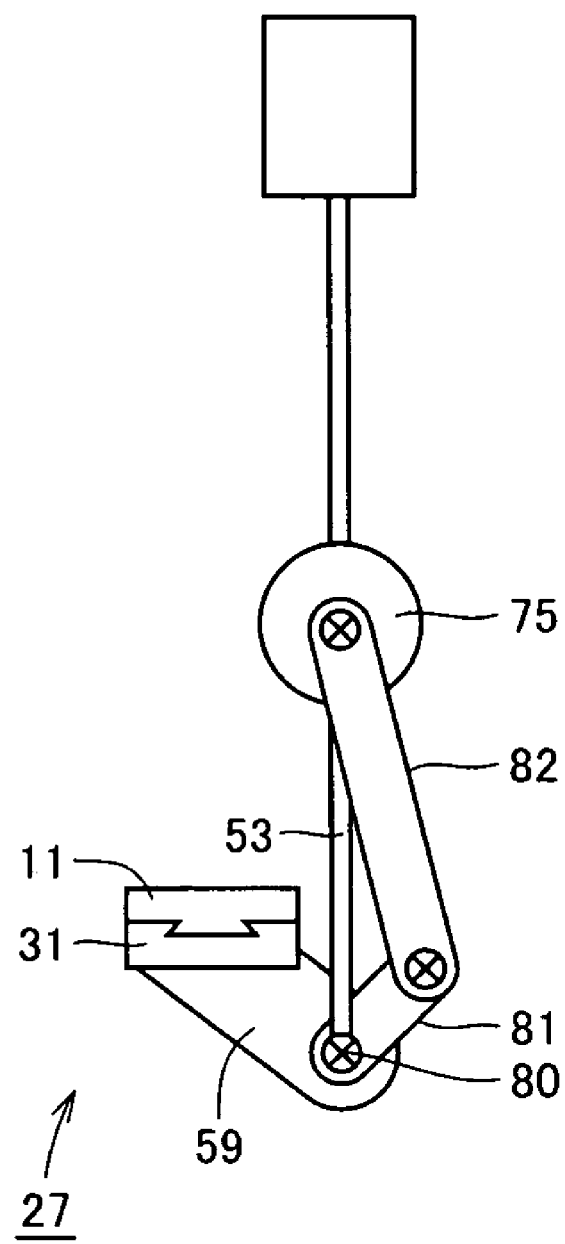
FIG. 16 is a diagram showing a thin plate manufacturing apparatus according to a seventh embodiment of the present invention.

FIG. 16 is a diagram illustrating a substrate holder 27 of a dipping mechanism in a thin plate manufacturing method according to a seventh embodiment of the present invention in detail. A pedestal 31 engaging with a substrate 11 is connected to a pedestal support member 49, which in turn is held by a suspension support 53 to be slidable about a rotation axis 80. The rotation axis 80 is connected to a rotation mechanism 75 through power transmission mechanisms 81 and 82 such as chains or belts, for example. The substrate 11 is rotated by rotating the rotation mechanism 75.

Figure 17:
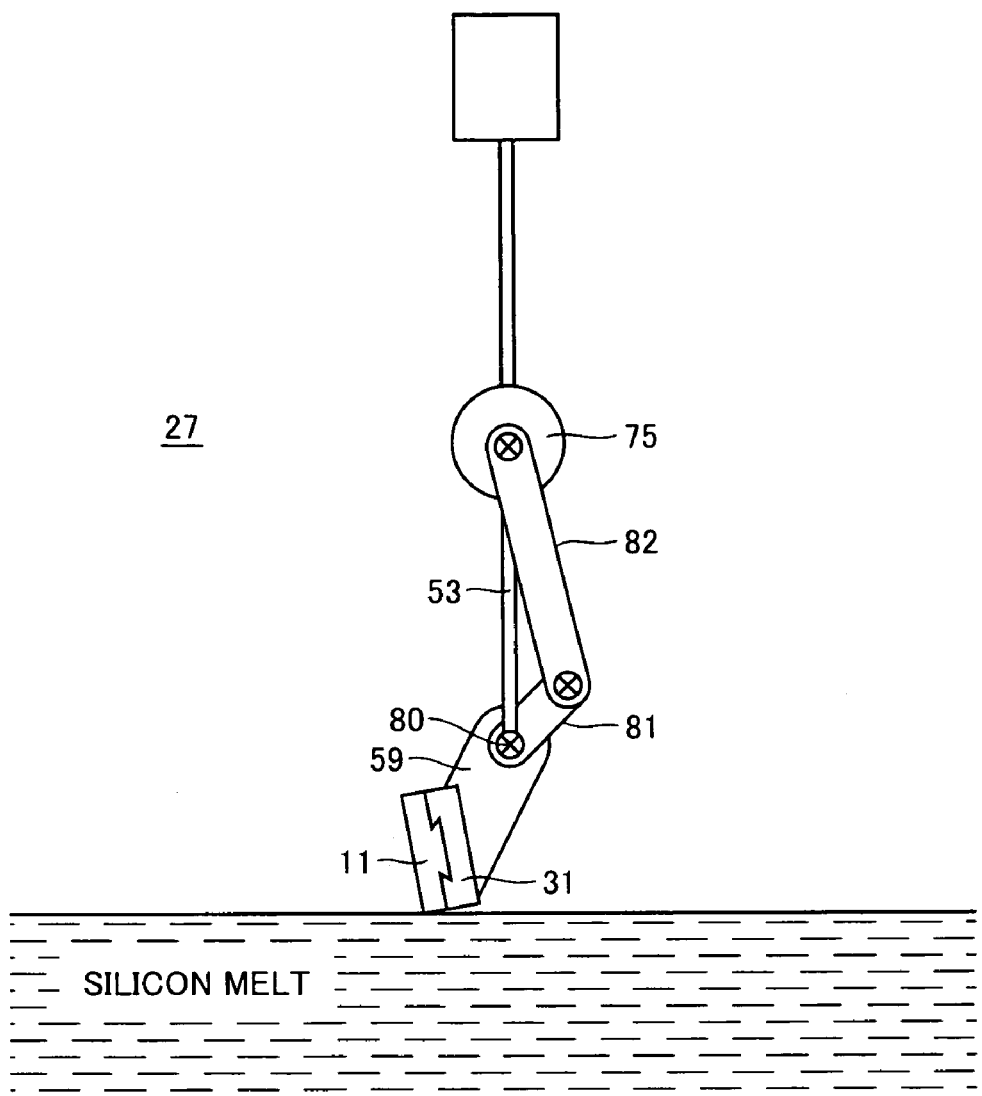
FIG. 17 is a diagram showing a state of manufacturing a thin plate with the apparatus shown in FIG. 16.

When employing the substrate holder 27 shown in FIG. 16, a thin plate can be grown by enabling positioning before and after dipping into a melt by the rotation mechanism, a transverse moving mechanism and a vertical moving mechanism while dipping the substrate into a melt and thereafter pulling up the same from the melt as shown in FIG. 17.

Eighth Embodiment

Figure 18:
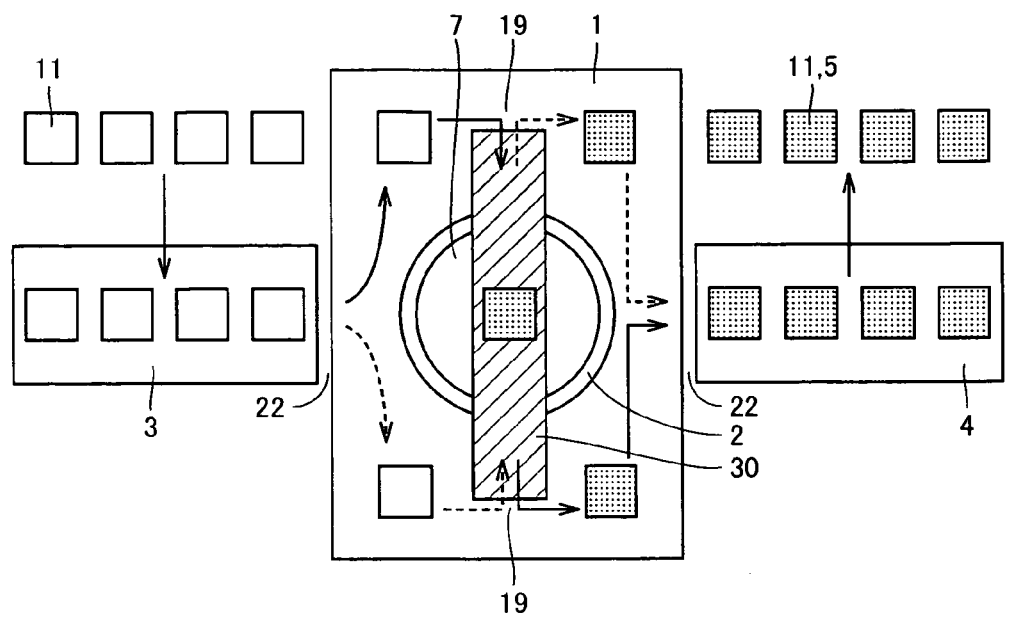
FIG. 18 is a diagram showing a thin plate manufacturing apparatus according to an eighth embodiment of the present invention.

FIG. 18 is a diagram showing a thin plate manufacturing apparatus according to an eighth embodiment of the present invention. This embodiment is characterized in that two positions are provided for mounting/demounting substrates on/from a dipping mechanism 30 for performing dipping once in a unidirectional movement of the dipping mechanism and performing dipping once also in a return movement therefrom. Mounting positions 19 also express positions for demounting the substrates. According to the third and fourth embodiments, no dipping was performed in an intermediate stage of returning after dipping by the dipping mechanism. According to this embodiment, however, dipping is performed both in forward and backward processes. In this case, a single loading subsidiary chamber and a single unloading subsidiary chamber are employed for transferring the substrates to the two mounting positions 19 from the single loading subsidiary chamber and transferring the same from the two substrate mounting positions 19 to the single unloading subsidiary chamber.

FIG. 19 is a diagram showing the time series of manufacturing according to this embodiment. This manufacturing flow is identical to that of FIG. 10 for the most part. The difference resides in that the return time is required after the dipping operation in FIG. 10 while the substrates are mounted/demounted immediately after the dipping operation and the subsequent dipping operation can be performed immediately after the same without a return operation in FIG. 19. Therefore, the stroke for forming silicon thin plates on four substrates can be reduced to 65 seconds. This corresponds to 16 seconds per substrate.

Figure 20:
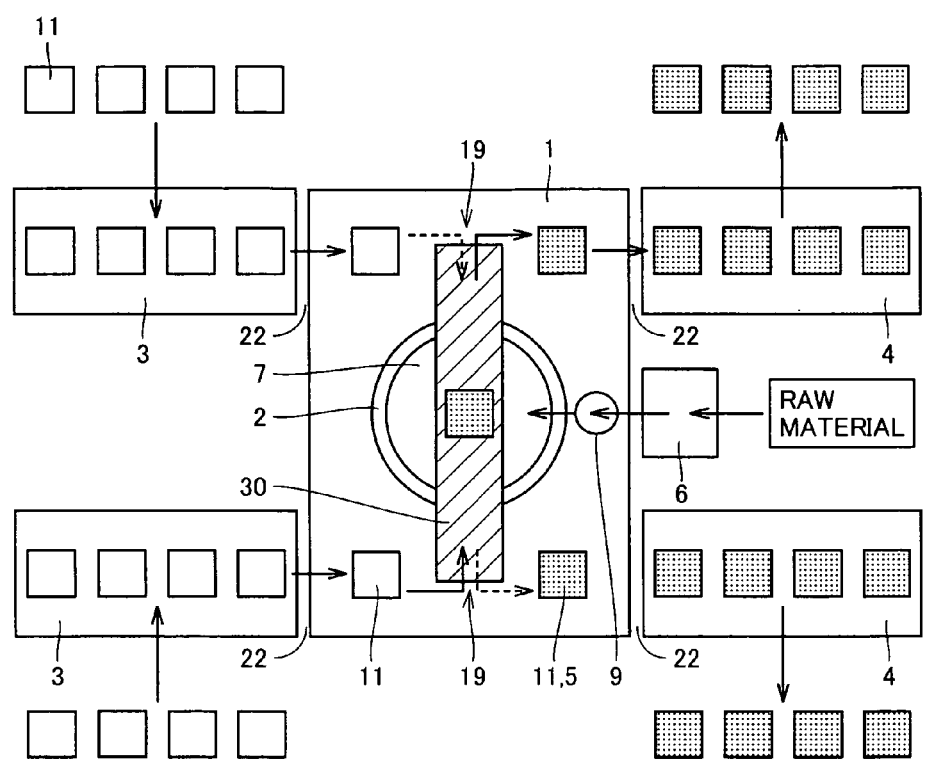
FIG. 20 is a diagram showing a modification of the thin plate manufacturing apparatus according to the eighth embodiment of the present invention.

FIG. 20 is a diagram showing a modification of the thin plate manufacturing apparatus employing the forward and backward processes of the dipping mechanism 30 for dipping. This case is characterized in that two loading subsidiary chambers 3 and two unload subsidiary chambers 4 are provided. The structure can be simplified by employing this thin plate manufacturing apparatus since no mechanism is required for distributing or collecting substrates 11 into or from two portions in a main chamber 1. Further, the rate of the working times in the subsidiary chambers in the overall operation can be reduced from one operation/four dipping to one operation/eight dipping for further reducing the stroke without remarkably increasing the length of the apparatus, by synchronizing the operations of the two loading subsidiary chambers and the operations of the two unloading subsidiary chambers with each other respectively.

Ninth Embodiment

Figure 21:
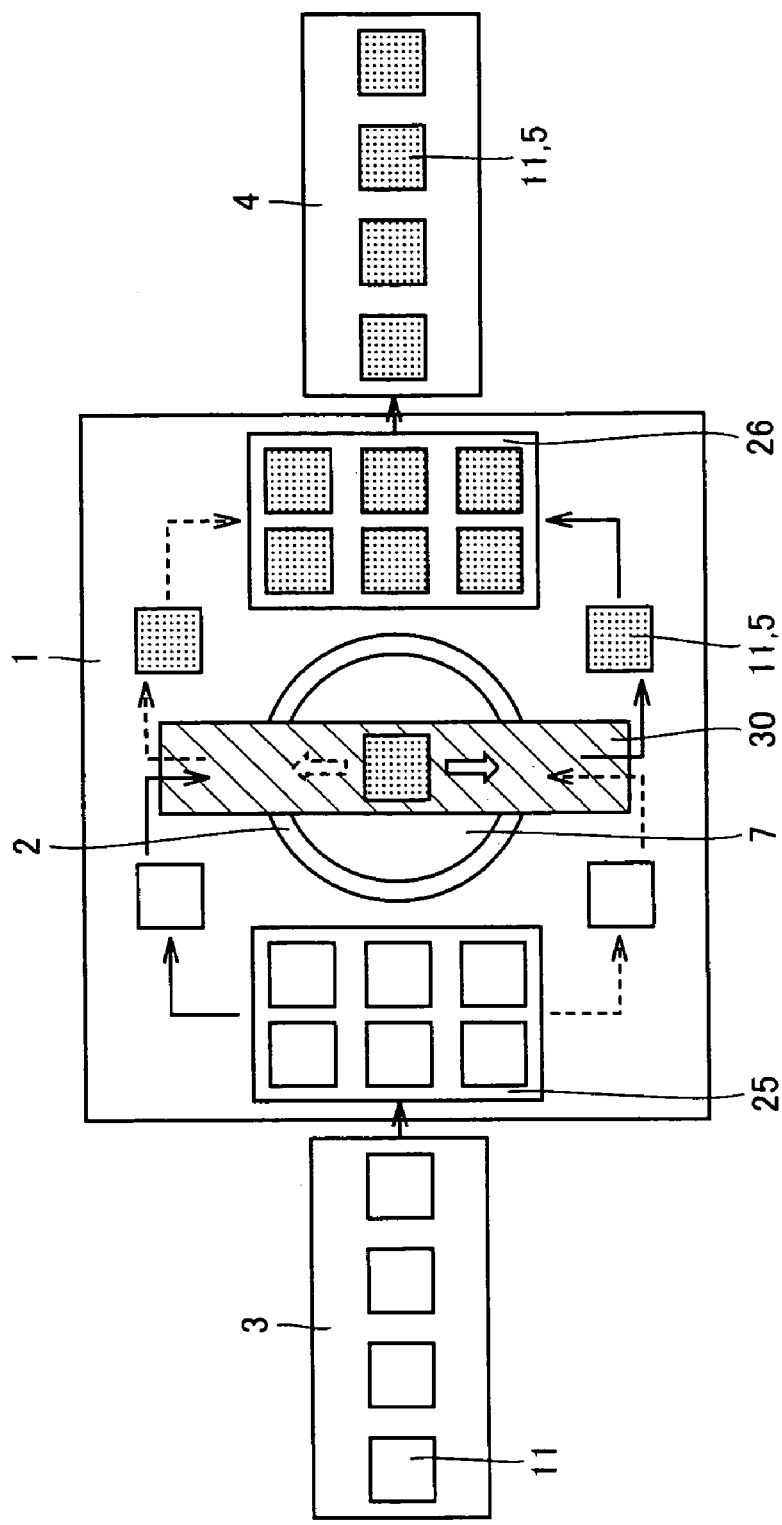
FIG. 21 is a diagram showing a thin plate manufacturing apparatus according to a ninth embodiment of the present invention.

FIG. 21 is a diagram showing a thin plate manufacturing apparatus according to a ninth embodiment of the present invention. This embodiment is characterized in that a mounting standby position 25 and an unloading standby position 26 are provided in a main chamber. The mounting standby position 25 and the unloading standby position 26 function as buffers in supply of substrates 11 from a loading subsidiary chamber 3 to a dipping mechanism 30 and unloading from the dipping mechanism 30 to an unloading subsidiary chamber 4. Therefore, operations of the respective subsidiary chambers and the operation of the dipping mechanism can be rendered independent of each other. Therefore, the stroke has no relation with the operations of the respective subsidiary chambers but is decided by only the operation of the dipping mechanism. The number of substrates capable of standing by on the mounting standby position must be in excess of the number of substrates simultaneously supplied from the subsidiary chamber. Similarly, the number of substrates capable of standing by on the unloading standby position must be in excess of the number of substrates simultaneously unloaded into the subsidiary chamber.

FIG. 22 is a diagram showing the time series of manufacturing in the thin plate manufacturing apparatus shown in FIG. 21. According to FIG. 22, the dipping mechanism can parallelly continue the operation during the operations of the subsidiary chambers remarkably influencing the stroke. Consequently, the stroke for forming silicon thin plates on four substrates is reduced to 40 seconds, for implementing remarkable reduction. This corresponds to 10 seconds per silicon thin plate.

Tenth Embodiment

Figure 23:
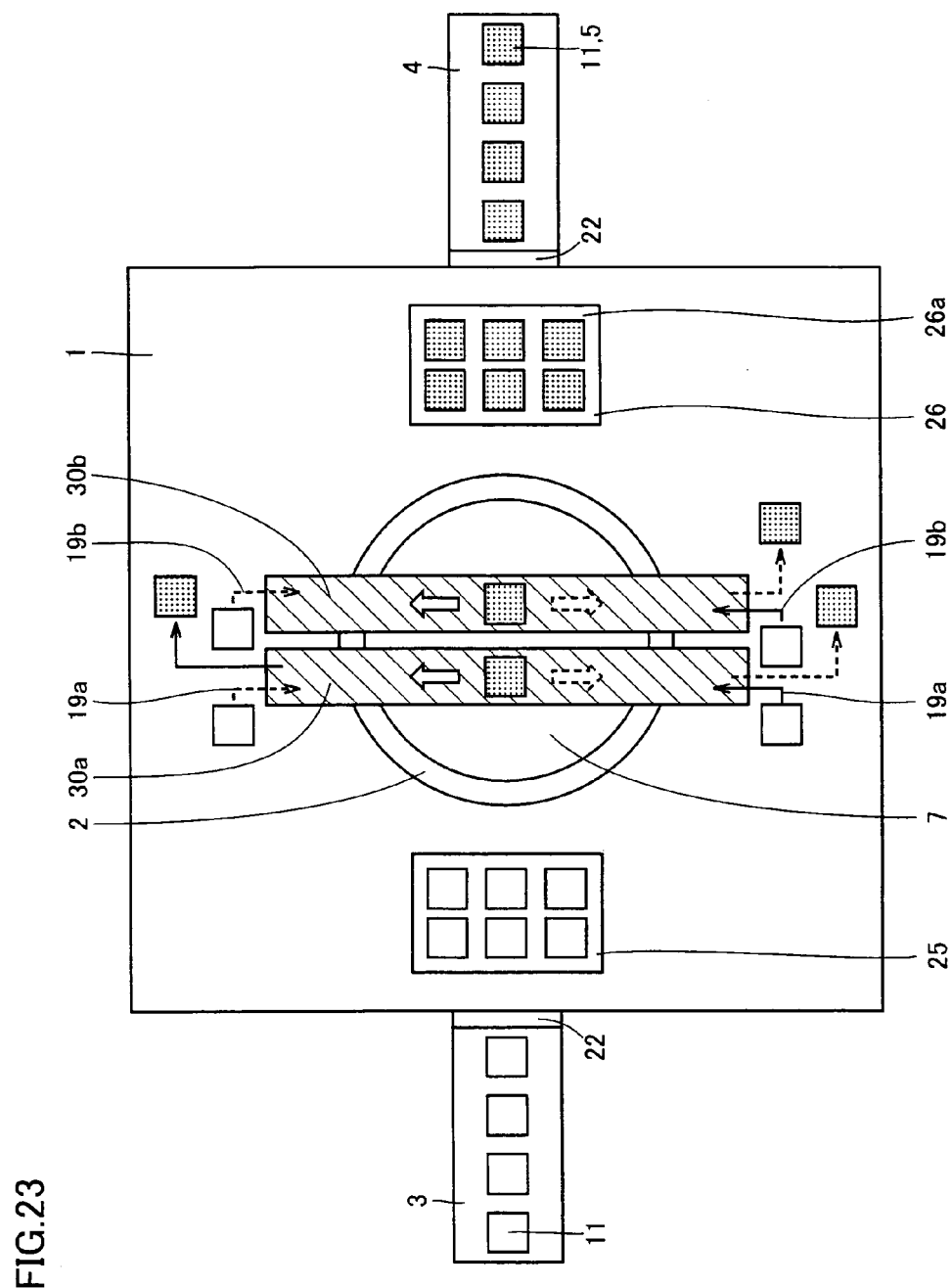
FIG. 23 is a diagram showing a thin plate manufacturing apparatus according to a tenth embodiment of the present invention.

FIG. 23 is a diagram showing a thin plate manufacturing apparatus according to a tenth embodiment of the present invention. This embodiment is characterized in that two dipping mechanisms 30a and 30b are provided for a single crucible. The two dipping mechanisms are so provided that the other dipping mechanism 30b can progress another operation when one of the dipping mechanisms, e.g. the dipping mechanism 30a performs a dipping operation. It is difficult to remarkably reduce an actual dipping time in the dipping operation on the basis of crystal growth conditions for silicon thin plates. However, the stroke can be halved over the total dipping treatment time by the two dipping mechanisms progressing different operations in the same period.

FIG. 24 shows the time series of thin plate manufacturing in the case of employing two dipping mechanisms as described above so that the dipping mechanisms perform operations in a deviating manner for deviating the dipping operations thereof in the crucible from each other. According to FIG. 24, the stroke for forming silicon thin plates on four substrates can be reduced to 20 seconds. This corresponds to 5 seconds per substrate. The dipping step time per substrate is extremely reduced as compared with the dipping step time of 20 seconds per substrate according to the first embodiment.

Referring to FIG. 23, a cooling installation 26 is provided for the following reason: When the cycle time is reduced as described above, the time for natural cooling is also remarkably reduced. Therefore, the substrates carrying silicon thin plates may be not yet sufficiently cooled but in a high temperature state when discharged from the apparatus through an unloading subsidiary chamber 4. Therefore, the substrates may expose a mechanism for separating silicon thin plates 5 from the substrates 11 outside the apparatus to a high temperature, to cause inconvenience on the separation mechanism or other mechanisms. In order to avoid this, the aforementioned substrates 11 can be cooled to a sufficiently low temperature by providing a cooler 26a on an unloading standby position 26 for holding the substrates 11 formed with the silicon thin plates 5 in a main chamber 1 as shown in FIG. 23.

As hereinabove described, the number of substrates capable of standing by on the unloading standby position must be in excess of the number of substrates simultaneously unloaded into the subsidiary chamber. When cooling is also performed on the unloading standby position, however, substrates must be made to stand by/cooled in a number obtained by adding a number (time (seconds) necessary for cooling substrates/dipping step time per substrate (seconds/number)) to the aforementioned number. Assuming that the time necessary for cooling the substrates is 10 seconds and four substrates are simultaneously unloaded into the subsidiary chamber, for example, the dipping step time per substrate is 5 seconds and hence the number of standby substrates must be at least 4+(10/5)=6.

According to this embodiment, the stroke can be remarkably reduced by arranging two dipping mechanisms for the single crucible 2. Further, the problem of insufficient cooling of the substrates 11 formed with the silicon thin plates 5 following reduction of the stroke can be solved by providing a cooling apparatus on any position in the main chamber 1, the unloading subsidiary chamber 4 or outside the thin plate manufacturing apparatus.

While the single crucible is arranged in the main chamber 1 according to this embodiment, a plurality of crucibles may alternatively be employed for arranging a single dipping mechanism or a plurality of dipping mechanisms for each crucible. Further, a single dipping mechanism may perform dipping treatment on at least two crucibles.

Eleventh Embodiment

Figure 25:
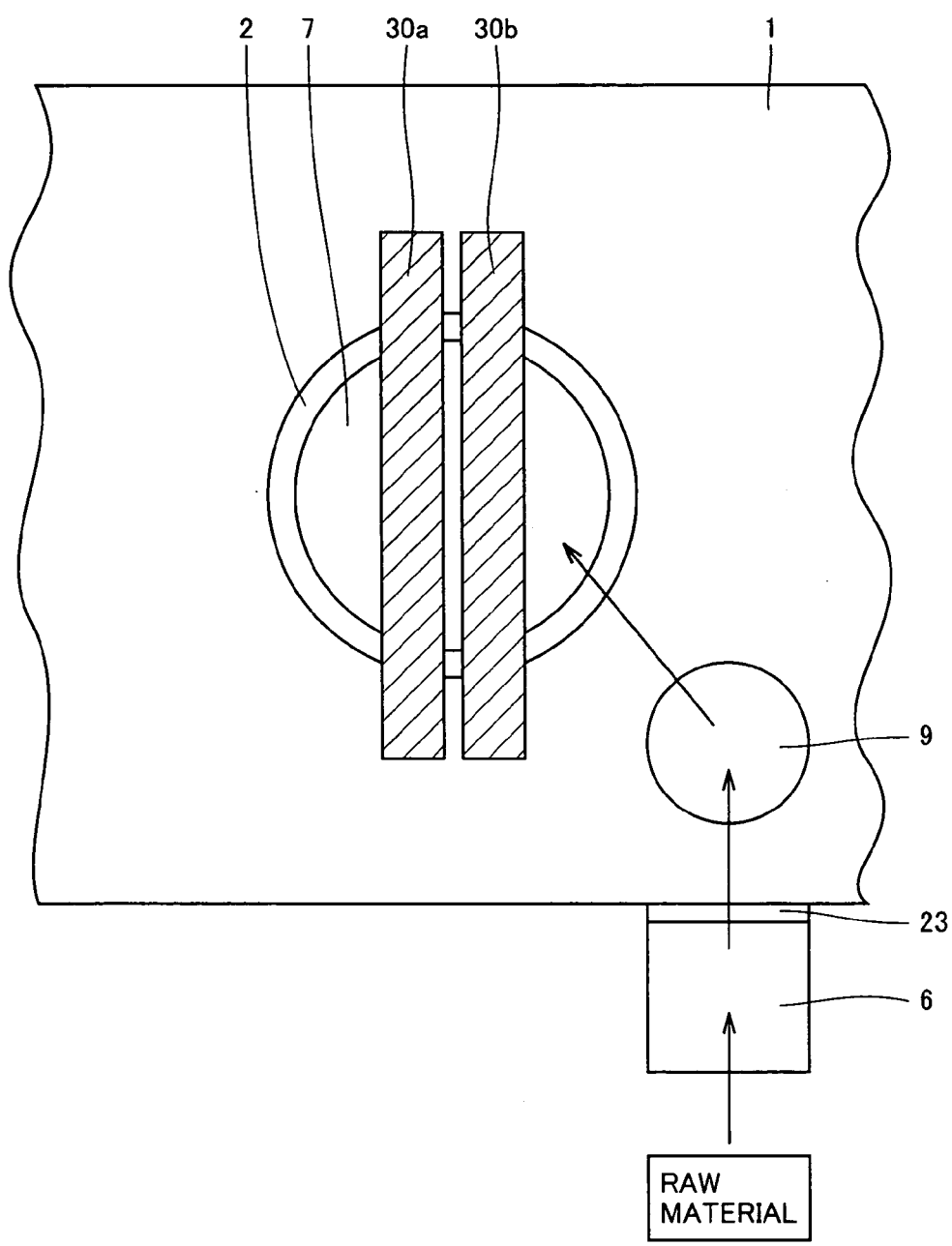
FIG. 25 is a diagram showing a thin plate manufacturing apparatus according to an eleventh embodiment of the present invention.

FIG. 25 is a diagram showing a thin plate manufacturing apparatus according to an eleventh embodiment of the present invention. This embodiment is characterized in that a refilling installation is arranged for refilling silicon with respect to a silicon melt 7 in a crucible 2.

When manufacturing a large number of silicon thin plates by operating a dipping mechanism, the level of the silicon melt 7 is lowered. It is possible to cope with the change of the level position by grasping the level position by image processing or laser measurement and correcting the orbit of substrates with respect to the silicon melt 7. When the quantity of the silicon melt 7 is remarkably reduced with respect to the crucible 2, however, interference between the wall surface of the crucible 2 and the orbit of the substrates or the bottom wall of the crucible 2 and the orbit of the substrates results in a problem. In other words, contact between the crucible 2 and the substrates results in a problem. If reduction of the quantity of the silicon melt 7 exceeds a prescribed range, therefore, the change of the level position cannot be coped with by correcting the orbit of the substrates.

When reduction of the quantity of the silicon melt 7 exceeds the prescribed range, the dipping operation must be temporarily interrupted for replenishing the silicon melt. As shown in FIG. 25, a refilling raw material is introduced into a refilling crucible 9 through the refilling subsidiary chamber 6 and heated to form a silicon melt. It is possible to cope with reduction of the quantity of the silicon melt 7 by adding the silicon melt to the crucible 2 at arbitrary timing. An airtight door 23 is provided between the refilling subsidiary chamber 6 and the main chamber 1. The refilling crucible 9 may be movable. A refilling chute or the like may be arranged between the refilling crucible 9 and the crucible 2. It is possible to avoid hindrance of movement of the substrates around the crucible 2 by rendering the refilling crucible 9 movable or arranging a movable refilling chute.

Assuming that refilling is performed once for 500 silicon thin plates, for example, as to the timing for refilling, the raw material is refilled once in 2500 seconds in the case of the ninth embodiment since the treatment time per substrate is 5 seconds. This time interval of 2500 seconds is a time capable of introducing the raw material for refilling from the refilling subsidiary chamber 6 into the main chamber 1 and melting the same in the refilling crucible 9. Therefore, the refilling operation can be parallelly progressed independently of the treatment of dipping the substrates in the crucible 2. The actual refilling time corresponding to the total time for refilling the silicon melt in the crucible 2 is about 30 seconds. Thereafter a melt temperature stabilizing time of about 10 minutes is required. The subsequent dipping operation cannot be performed for 630 seconds in total. This time is something over 25% with respect to the mounting pitch of 2500 seconds, and hence the cycle time per substrate is something over 5×1.25=6 seconds when manufacturing thin plates in order of several days or several weeks.

It has been made possible to continuously manufacture silicon thin plates in order of several days or several weeks by performing refilling according to this embodiment.

Twelfth Embodiment

The temperature of the substrates is controlled after mounting the substrates in each of the embodiments heretofore described. This is for suppressing the quantity of heat discharged by radiation to the utmost by suppressing the time lag between the temperature control of the substrates and dipping of the substrates into the melt. When heat loss resulting from radiation may not be taken into consideration due to a set temperature of not more than 700° C., for example, temperature control can be performed in a stage before mounting substrates. Further, temperature control is preferably performed in the stage before mounting substrates when a long temperature control time is required for homogenizing temperature distribution or the like.

When executing temperature control in a front stage in the ninth embodiment, for example, the temperature control can be performed in parallel with the dipping operation. The cycle time can be reduced by the substrate temperature control time (2 seconds×2 for four substrates). Further, the temperature control time can be increased by providing a plurality of temperature control mechanisms before mounting the substrates. In this case, the number of necessary temperature control mechanisms is at least (time (seconds) necessary for temperature control/dipping step time (seconds/number) per substrate). Assuming that the time necessary for temperature-controlling the substrates is 8 seconds, for example, the number of necessary temperature control mechanisms is at least two stages since the dipping step time per substrate is 4 seconds.

A heater or the like can be employed for temperature-controlling the substrates. The heater can be arranged on the mounting standby positioning the main chamber or the like.

The number of the substrates capable of standing by on the mounting standby position must be in excess of the number of substrates simultaneously supplied from the subsidiary chamber. When the temperature of the substrates is also controlled on the mounting standby position, however, substrates must be added by a number corresponding to the number of stages for temperature-controlling the substrates, in addition to the aforementioned number. Assuming that the number of substrates simultaneously supplied from the subsidiary chamber is 4, for example, the number of standby substrates must be at least (4+2) since the number of stages of the substrate temperature control mechanisms is at least 2 as described above.

While the embodiments of the present invention have been described in the above, the embodiments of the present invention disclosed in the above are merely illustrative, and the scope of the present invention is not restricted to these embodiments of the present invention. The scope of the present invention is shown by the description of the scope of claim for patent, and further includes all modifications within the meaning and range equivalent to the description of the scope of claim for patent.

The thin plate manufacturing method and the thin plate manufacturing apparatus according to the present invention are so employed that the atmosphere of the main chamber can be stably maintained in a prescribed range also in mass production since substrates are loaded into the main chamber through the subsidiary chamber and subjected to the dipping treatment. Therefore, it is possible to manufacture high-quality silicon thin plates with a high yield. Further, silicon thin plates can be manufactured with high efficiency by arranging at least two dipping mechanisms for a single crucible. In addition, a long-term continuous operation can be performed by refilling a silicon melt through the subsidiary chamber thereby reducing a downtime required for refilling. Consequently, the cost for silicon thin plates can be reduced.

INDUSTRIAL APPLICABILITY

A large quantity of high-quality silicon thin plates can be stably produced continuously over a long time by employing the inventive thin plate manufacturing method and thin plate manufacturing equipment. Thus, a large quantity of silicon thin plates can be supplied at a low cost, and it is expected that the present invention is widely employed for manufacturing silicon thin plates for photovoltaic power generation, for example.

The invention claimed is:

1. A thin plate manufacturing method of manufacturing a thin plate with a dipping mechanism dipping a surface layer part of a substrate into a melt of a substance including at least either a metallic material or a semiconductor material in a crucible arranged in a main chamber and unloading said substrate by solidifying said melt on the surface of said substrate, loading said substrate into said main chamber through at least one loading subsidiary chamber adjacent to said main chamber and unloading said substrate from said main chamber through at least one unloading subsidiary chamber adjacent to said main chamber, and using a vacuum to set the pressure in the loading subsidiary chamber less than atmospheric pressure and substantially the same as the pressure in the main chamber and introducing inert gas into the loading subsidiary chamber and the main chamber, and using a vacuum to set the pressure in the unloading subsidiary chamber less than atmospheric pressure and substantially the same as the pressure in the main chamber and introducing inert gas into the unloading subsidiary chamber.

2. The thin plate manufacturing method according to claim 1, wherein switching means is arranged between said main chamber and the subsidiary chamber, for loading said substrate into said main chamber and unloading said substrate from said main chamber along with switching of said switching means.

3. The thin plate manufacturing method according to claim 2, wherein said subsidiary chamber is constituted of a loading subsidiary chamber and a unloading subsidiary chamber, for synchronizing switching timings of the switching means for said loading subsidiary chamber and the switching means for the unloading subsidiary chamber with each other when opening and closing said loading subsidiary chamber and the unloading subsidiary chamber as well as said main chamber by switching said switching means.

4. The thin plate manufacturing method according to claim 1, introducing inert gas into said main chamber while setting the pressure of the atmosphere of the main chamber to not more than the atmospheric pressure.

5. The thin plate manufacturing method according to claim 1, wherein said subsidiary chamber is constituted of a loading subsidiary chamber and a unloading subsidiary chamber for loading said substrate into the main chamber through said loading subsidiary chamber and unloading the substrate to which said thin plate is bonded from the main chamber through said unloading subsidiary chamber.

6. The thin plate manufacturing method according to claim 1, mounting said substrate on said dipping mechanism, bonding the thin plate by opposing a thin plate growth surface of said substrate to the melt and thereafter directing the thin plate growth surface to which said thin plate is bonded upward on a position other than a position immediately above said crucible for demounting the substrate from said dipping mechanism along with the thin plate in said main chamber.

7. The thin plate manufacturing method according to claim 6, simultaneously introducing a plurality of said substrates into said subsidiary chamber from outside, simultaneously loading the plurality of substrates into said main chamber from said subsidiary chamber, further transferring the substrates to a mounting standby position in said main chamber and shifting the substrates one by one from said mounting standby position to a mounting position on said dipping mechanism.

8. The thin plate manufacturing method according to claim 6, transferring the substrate one by one from a demounting position for demounting the substrate to which said thin plate is bonded from said dipping mechanism into an unloading standby position in said main chamber and simultaneously unloading a plurality of substrates from said unloading standby position into said subsidiary chamber when said substrates accumulate by a prescribed number on said unloading standby position.

9. The thin plate manufacturing method according to claim 6, wherein said dipping mechanism performs demounting of the substrate to which the thin plate is bonded and mounting of a substrate to which a thin plate is newly bonded through the same operation.

10. The thin plate manufacturing method according to claim 6, equalizing, in a series of operations of said dipping mechanism moving the substrate from a mounting/demounting position for mounting and demounting the substrate to a position for dipping the substrate into said melt, performing a dipping operation on said substrate for dipping said substrate and thereafter moving said substrate to the mounting/demounting position for demounting said substrate, the direction of the horizontal operation of said substrate with an operational direction for moving the substrate to said mounting/demounting position when performing said dipping operation.

11. The thin plate manufacturing method according to claim 6, wherein said dipping mechanism mounts a first substrate on a first position in said main chamber, moves onto said crucible for dipping said substrate into said crucible, thereafter moves for demounting said first substrate to which a thin plate is bonded on a second position different from said first position, mounts a second substrate to which a thin plate is newly bonded on said position, moves onto said crucible for dipping said substrate into said crucible and thereafter moves to said first position for demounting said second substrate to which the thin plate is bonded on said position.

12. The thin plate manufacturing method according to claim 6, detecting the position of a melt level in said crucible for controlling the operation of said dipping mechanism for dipping said substrate into the crucible in response to the position of said melt level.

13. The thin plate manufacturing method according to claim 6, bonding the thin plate to said substrate with a plurality of dipping mechanisms with respect to one said crucible.

14. The thin plate manufacturing method according to claim 1, cooling the substrate to which said thin plate is bonded on at least one position in said main chamber, in said subsidiary chamber and outside the chambers.

15. The thin plate manufacturing method according to claim 1, stopping the operation of said dipping mechanism when the quantity of the melt in said crucible decreases to a prescribed level for refilling a raw material into said crucible while not restarting the operation of said dipping mechanism until the temperature of the melt in the crucible and waving of the melt level thereafter stabilize.

16. The thin plate manufacturing method according to claim 15, loading said raw material into the main chamber through a refilling subsidiary chamber adjacent to said main chamber when refilling the raw material into said crucible.

17. The thin plate manufacturing method according to claim 1, simultaneously introducing a plurality of said substrates into said subsidiary chamber from outside and loading the substrates one by one from said subsidiary chamber into said main chamber.

18. The thin plate manufacturing method according to claim 1, unloading the substrate to which said thin plate is bonded one by one from said main chamber into said subsidiary chamber and simultaneously discharging a plurality of substrates from said subsidiary chamber.

19. The thin plate manufacturing method according to claim 1, performing temperature control of said substrate before mounting said substrate on said dipping mechanism.

* * * * *